US006849558B2

(12) United States Patent
Schaper

(10) Patent No.: US 6,849,558 B2
(45) Date of Patent: Feb. 1, 2005

(54) REPLICATION AND TRANSFER OF MICROSTRUCTURES AND NANOSTRUCTURES

(75) Inventor: Charles Daniel Schaper, Union City, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 31 days.

(21) Appl. No.: 10/246,379

(22) Filed: Sep. 17, 2002

(65) Prior Publication Data

US 2003/0219992 A1 Nov. 27, 2003

Related U.S. Application Data

(60) Provisional application No. 60/383,275, filed on May 22, 2002, provisional application No. 60/382,690, filed on May 23, 2002, provisional application No. 60/396,705, filed on Jul. 16, 2002, and provisional application No. 60/401,158, filed on Aug. 3, 2002.

(51) Int. Cl.[7] ........................ H01L 21/31; H01L 21/469
(52) U.S. Cl. ........................................ 438/758; 438/942
(58) Field of Search .......................... 438/758, 1, 311, 438/680, 681, 700, 736, 738, 789, 790, 793, 794, 933, 942, 947, 948, 949

(56) References Cited

U.S. PATENT DOCUMENTS 5,629,579 A * 5/1997 Zimmerman ................. 313/309
6,518,194 B2 * 2/2003 Winningham et al. ....... 438/717
6,656,568 B1 * 12/2003 Winningham et al. ....... 428/145

OTHER PUBLICATIONS

Stephen Chou, Peter Krauss, & Preston Renstrom. "Imprint Lithography with 25–Nanometer Resolution", Science vol. 272, Apr. 5, 1996 pp. 85–87, USA.

Stephen Chou, Peter Krauss, & Preston Renstrom. "Nanoimprint Lithography", Journal of Vacuum Science & Technology B vol. 14(6), Nov./Dec. 1996 pp. 4129–4133, USA.

Babak Heidari, Ivan Maximov, Eva–Lena Sarwe, & Lars Montelius, "Large scale nanolithography using nanoimprint lithography", Journal of Vacuum Science & Technology B vol. 17(6), Nov./Dec. 1999 pp. 2962–2964, USA.

Jan Haisma, Martin Verheuen, Kees Van Den Heuvel, & Jan Van Den Berg, "Mold–assisted nanolithography: A process for reliable pattern replication", Journal of Vacuum Science & Technology B vol. 14(6), Nov./Dec. 1996 pp. 4124–4128, USA.

Thomas Whidden, David Ferry, Michael Kozicki, Enoch Kim, Amit Kumar, James Wilbur, & George Whitesides, "Pattern transfer to silicon by microcontact and RIE", in Nanotechnology vol. 7, 1996, pp. 447–451, UK.

James Wilbur, Amit Kumar, Hans Biebuyck, Enoch Kim, & George Whitesides, "Microcontact printing of self–assembled monolayers: applications in microfabrication", in Nanotechnology vol. 7, 1996, pp. 452–457, UK.

(List continued on next page.)

Primary Examiner—David Nhu
(74) Attorney, Agent, or Firm—Franklin Schellenberg

(57) ABSTRACT

A method for the duplication of microscopic patterns from a master to a substrate is disclosed, in which a replica of a topographic structure on a master is formed and transferred when needed onto a receiving substrate using one of a variety of printing or imprint techniques, and then dissolved. Additional processing steps can also be carried out using the replica before transfer, including the formation of nanostructures, microdevices, or portions thereof. These structures are then also transferred onto the substrate when the replica is transferred, and remain on the substrate when the replica is dissolved. This is a technique that can be applied as a complementary process or a replacement for various lithographic processing steps in the fabrication of integrated circuits and other microdevices.

47 Claims, 16 Drawing Sheets

OTHER PUBLICATIONS

Younan Xia & George Whitesides, "Soft lithography", in Annual Reviews of Material Science vol. 28, 1998, pp. 153–184, USA.

Shinichi Ueki, Isao Ashida, & Hiroichi Kawahira, "New data processing of dummy pattern generation adaptive for CMP process", in Photomask and X–Ray mask Technology VI, H. Morimoto, ed. Proceedings of the SPIE vol. 3748, Apr. 1999 pp. 265–272, USA.

M. Colburn, S. Johnson, M. Stewart, S. Damle, T. Tailey, B. Choi, M. Wedlake, T. Michaelson, S.V. Sreenivasan, J. Ekerdt, & C. Grant Willson, "Step and flash imprint lithography: A new approach to high–resolution printing", in Emerging Lithographic Technologies III, Y. Vladimirsky, ed. Proceedings of the SPIE vol. 3676, Mar. 1999, pp. 379–389, USA.

P. Ruchhoeft, M. Colburn, B. Choi, H. Nounu, S. Johnson, T. Bailey, S. Damle, M. Stewart, J. Ekerdt, S.V. Sreenivasan, J.C. Wolfe, & C. Grant Willson, "Patterning curved surfaces: Template generation by ion beam proximity lithography and relief transfer by step and flash imprint lithography", Journal of Vacuum Science & Technology B vol. 17(6), Nov./Dec. 1996 pp. 2965–2969, USA.

\* cited by examiner

FIGURE 1: Processing steps for pattern formation by E-Beam Lithography (Prior Art).

FIGURE 2: Processing steps for pattern formation by the nanoimprint technique of Chou (Prior Art).

FIGURE 3: Processing steps for the step and flash process of Willson (Prior Art)

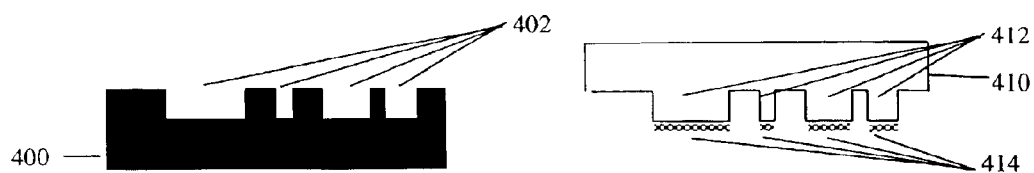
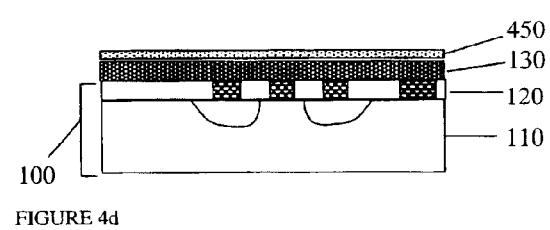
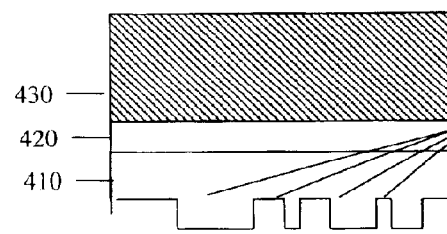
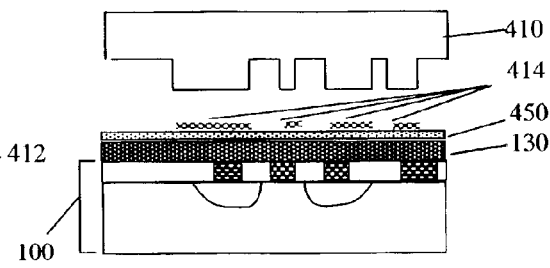
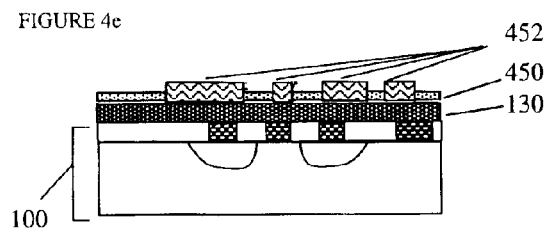
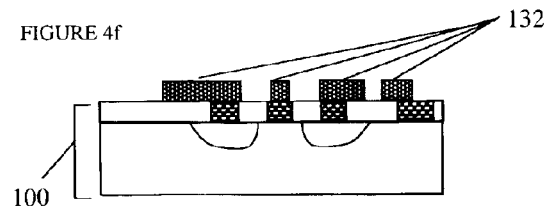
FIGURE 4: Processing steps for the microcontact printing of Whitesides (Prior Art).

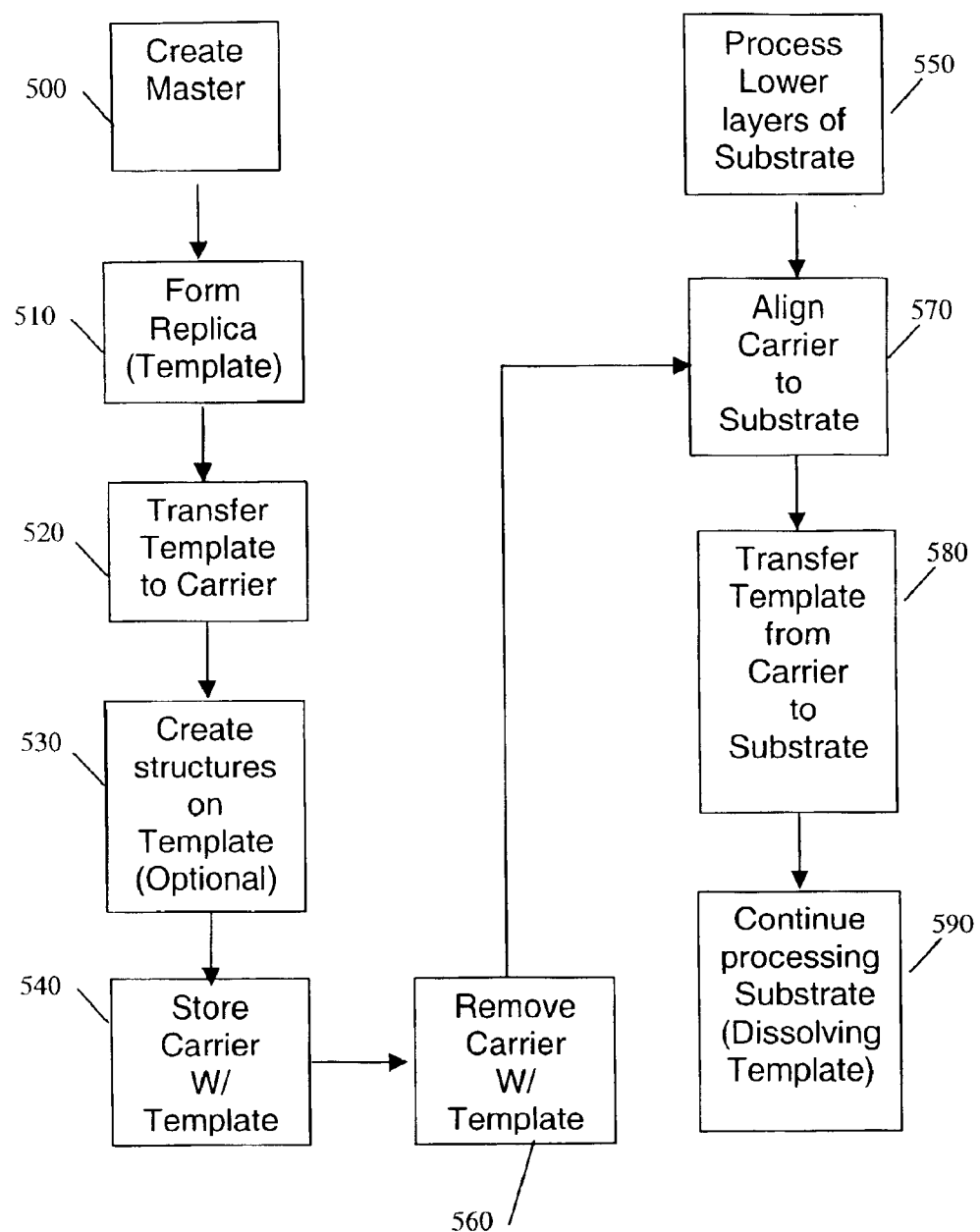
FIGURE 5: Flow chart of generic process according to the invention.

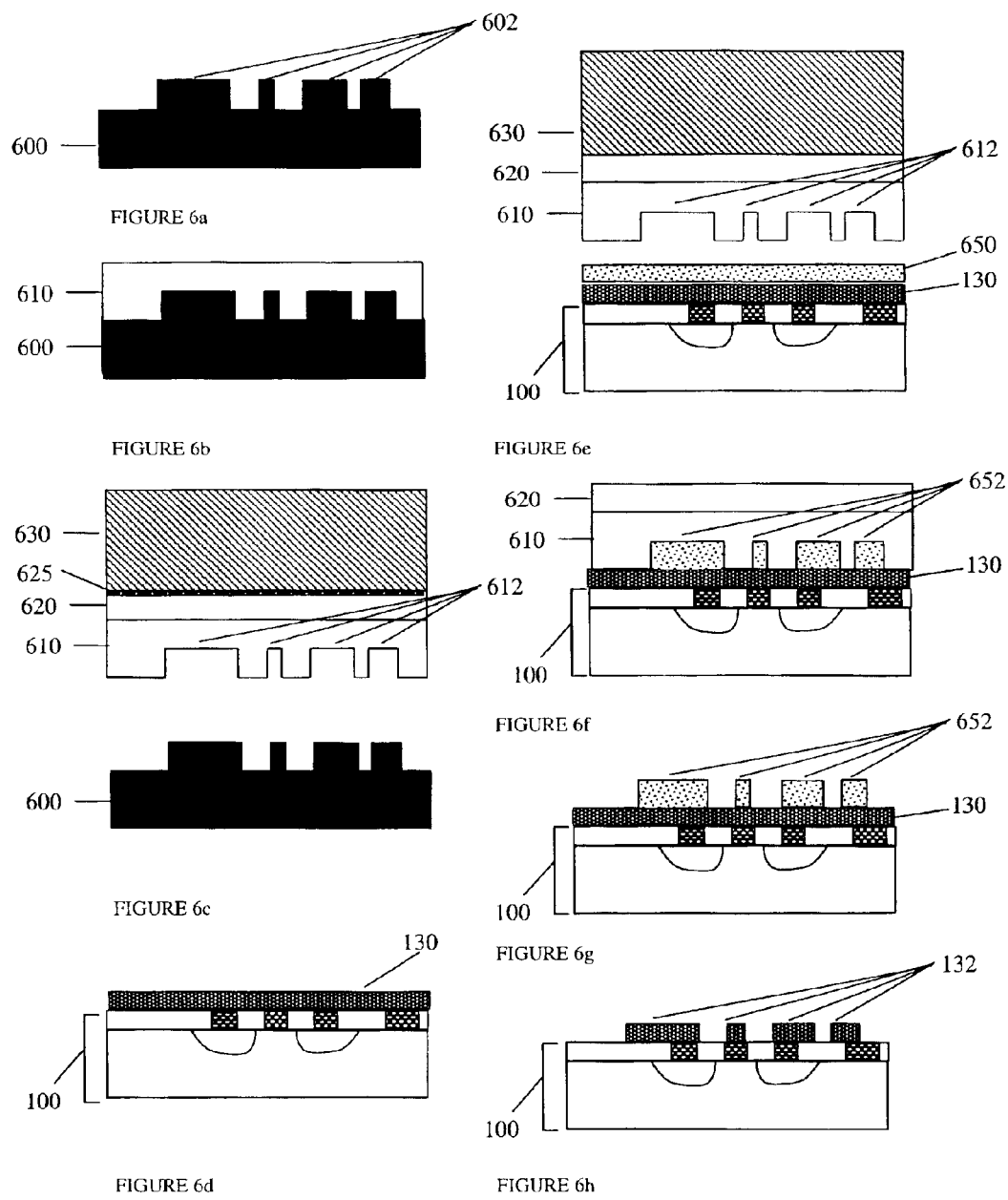
FIGURE 6: Processing steps for a nanoimprint process using a dissolvable template according to the invention.

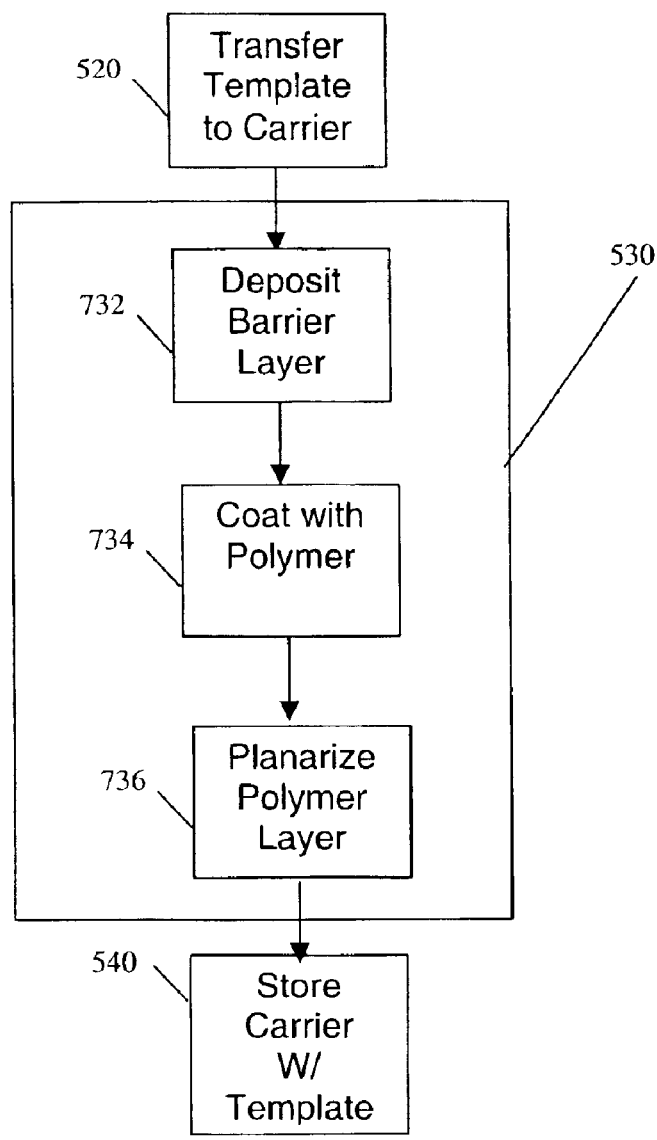
FIGURE 7: Representative flow chart for additional processing on the template.

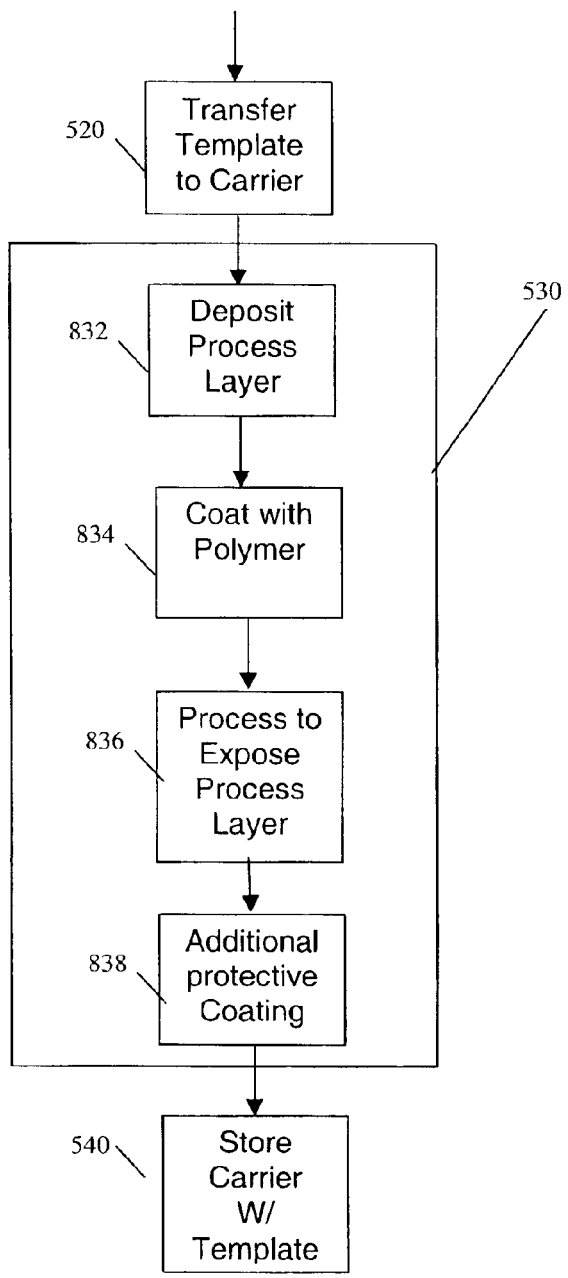
FIGURE 8: Representative flow chart for the creation of nanostructures on the template.

FIGURE 9: Processing steps for the preparation of masters.

FIGURE 10: Additional processing steps for the preparation of a multilayer master.

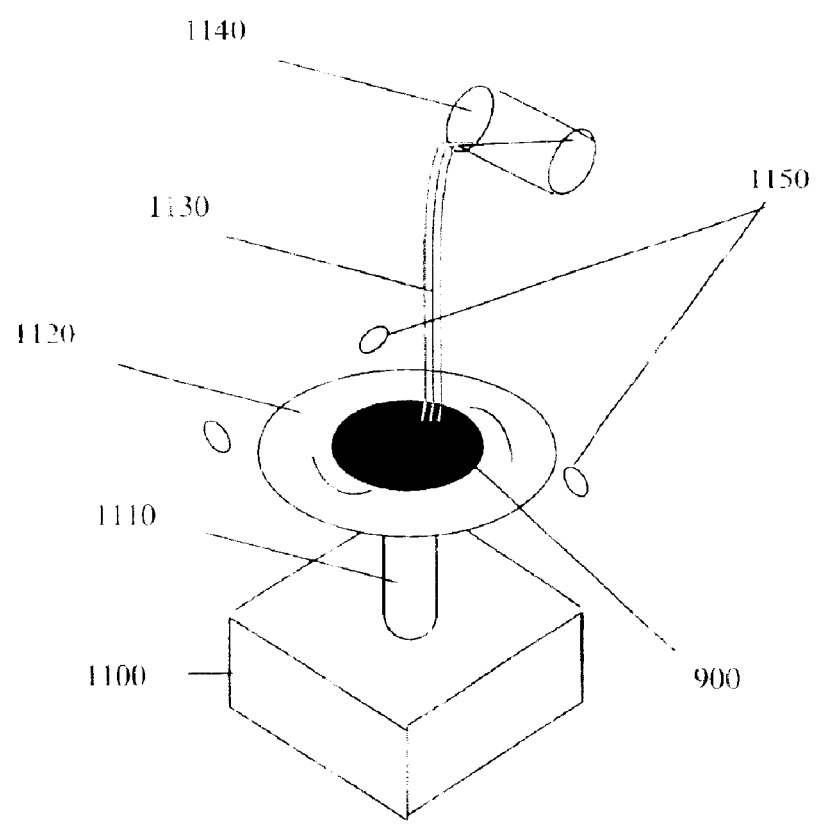
FIGURE 11: A conventional spin coating apparatus

FIGURE 12: Processing steps for using a pre-formed disk.

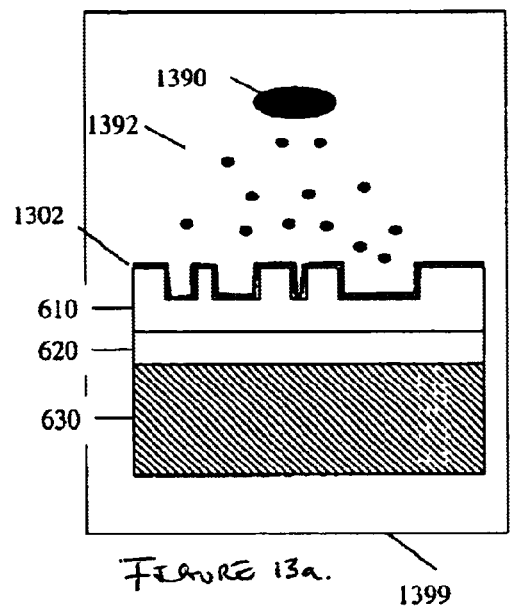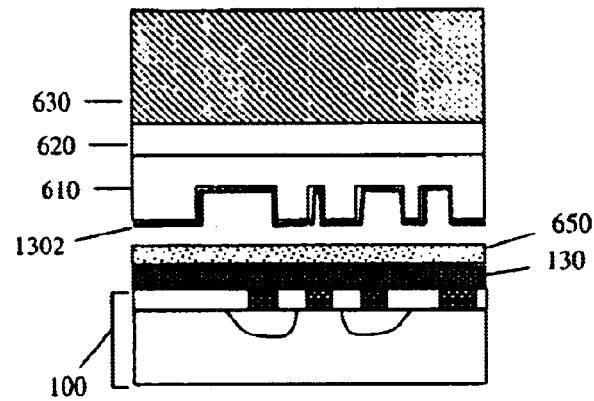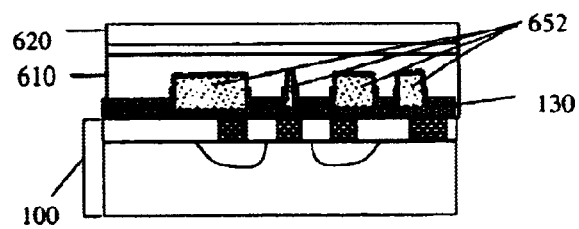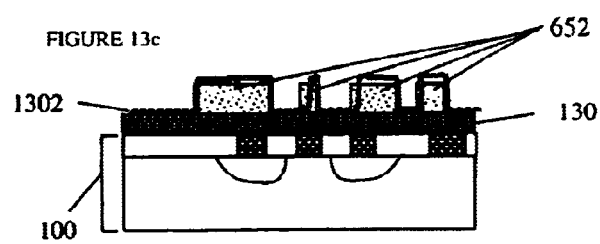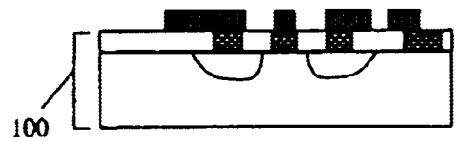
FIGURE 13: Process steps for sputtering onto a template and a nanoimprint process using that template.

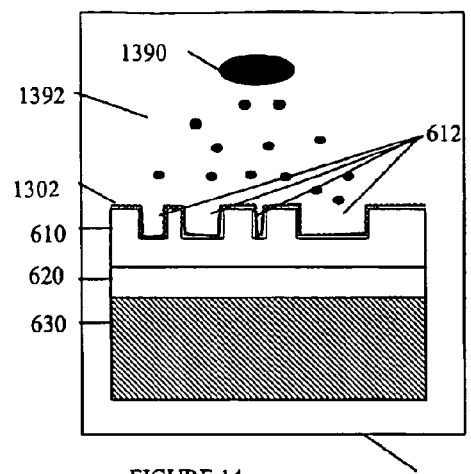
FIGURE 14a
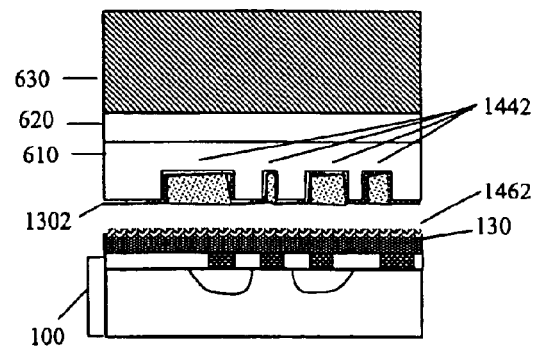
FIGURE 14d
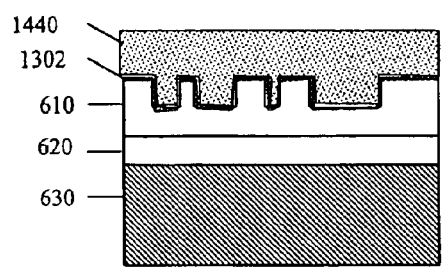
FIGURE 14b
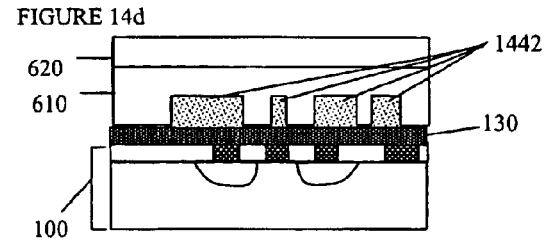
FIGURE 14e
FIGURE 14f
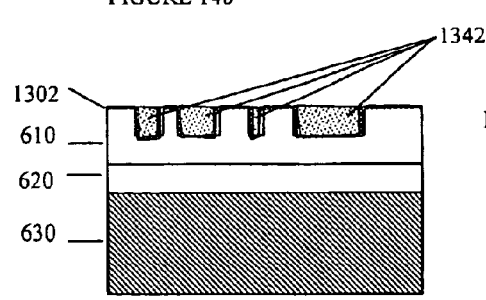
FIGURE 14c
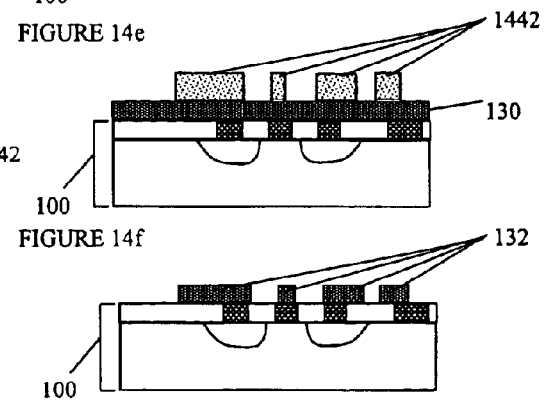
FIGURE 14g
FIGURE 14: Process steps for preparing patterned materials on a template and transferring the patterned materials to a substrate.

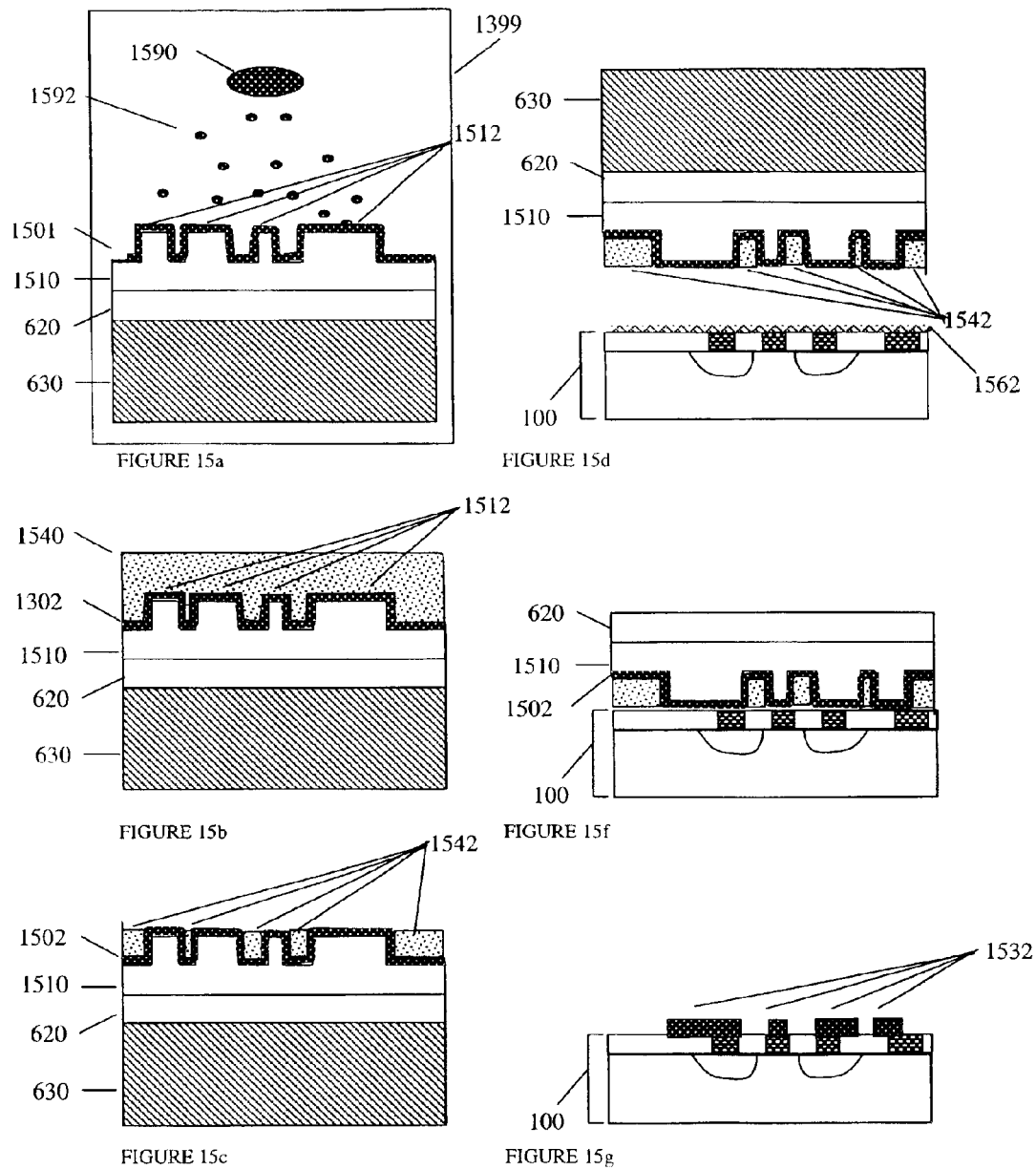
FIGURE 15: Process steps for preparing nanostructures on a template and transferring the nanostructures to a substrate.

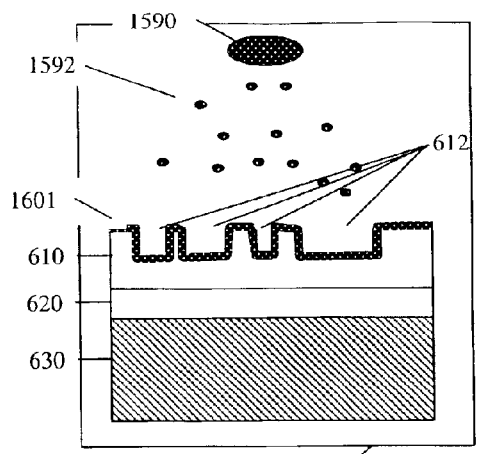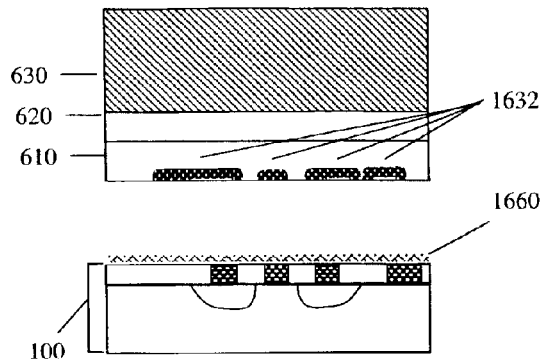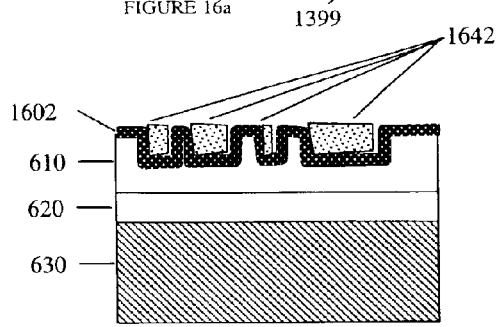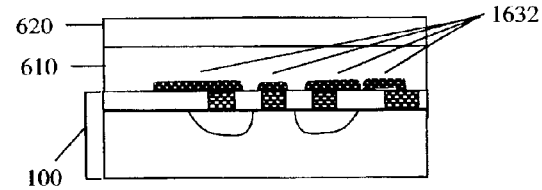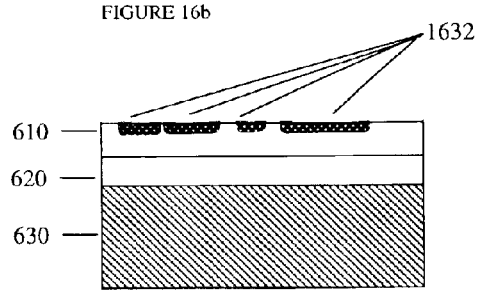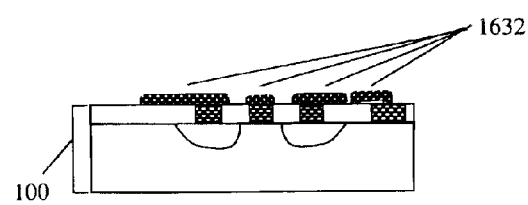
FIGURE 16: Alternative processing steps for preparing patterned materials on a template and transferring the patterned materials to a substrate.

REPLICATION AND TRANSFER OF MICROSTRUCTURES AND NANOSTRUCTURES

RELATED INVENTIONS

This application relates to, claims the benefit of the filing date of, and incorporates by reference the United States provisional patent applications entitled "Transfer lithography printing strategy", No. 60/383,275, filed May 22, 2002, "Method and means for template manufacture", No. 60/382,690, filed May 23, 2002, "Lithographic imprint array method and means", No. 60/396,705, filed Jul. 16, 2002, "Molecular transfer lithography method and means from template", No. 60/401,158, filed Aug. 3, 2002, which are all assigned to the assignee of the present invention.

The invention was made with government support under Grant (Contract) No. N66001-01-1-8962 awarded by the Defense Advanced Research Projects Agency (DARPA). The government has certain rights to this invention.

FIELD OF THE INVENTION

This invention relates to a new process for the replication of surface relief at the micrometer and the nanometer dimension scale. Furthermore, the process provides for the transfer of the replicated pattern from a master substrate to a second substrate. This invention describes a method of transfer lithography in which a disposable intermediate template is used. The process is also suitable for replicating and/or transferring single or multiple layers of microscopic elements that are to be used for photonic applications, metrology applications, and in the fabrication of integrated circuits and other microdevices.

BACKGROUND OF THE INVENTION

Microlithographic patterning of integrated circuits has made great improvements in the recent years. Prototype devices with dimensions less than 100 nm in width have been demonstrated, and are expected to enter routine production soon.

These integrated devices are typically assembled sequentially, through a series of process steps that carry out the necessary deposition, patterning, and etching steps that result in the final device. A contemporary microdevice often comprises more than 25 distinct layers, each with its own mask to define feature dimensions, and a sequence of process steps that the entire wafer must undergo to create the desired layer.

Extremely high resolution lithography can be carried out using electron beam (or E-beam) lithography. This prior art technique for fabricating microdevices is illustrated in FIG. 1. In this example, a partially fabricated substrate 100, comprising an underlying substrate 110 with the previously fabricated layers 120 containing microstructures 112 and 122, is coated with a uniform layer 130 of the material to be processed (e.g. metal, polysilicon, etc.), and then coated with a polymer layer 150, commonly called a resist, sensitive to electron beam exposure. The sensitive layer 150 is then exposed to patterns of electron beams 160, as shown in FIG. 1a, where the geometric arrangement and dose defines the pattern to be formed. The exposed material is then chemically processed, or developed, and, as shown in FIG. 1b, the unexposed regions 152 are left on the substrate. These serve as protection for portions of the material to be patterned 130, so that after subsequent processing, as shown in FIG. 1c, only the protected portions 132 of the material 130 to be processed remain.

Although E-beam lithography can produce extremely high resolution patterns, the typical throughput of an E-beam machine is very slow. Beams must be directed to each spot on the wafer in sequence, which makes the process generally slow and impractical for large numbers of microstructures. Instead, in optical lithography, the E-beams 160 are replaced by an optical image of a mask, which exposes the sensitive film 150 in parallel. However, optical imaging techniques do not have the same resolution as E-beam systems, and fabricating nanostructures (features with dimensions on the order of 100 nm or smaller) in these layers has been growing exponentially more expensive. As a result, alternative paradigms for lithography of these layers have been investigated.

One example of these novel technological patterning paradigms is nanoimprint technology. In nanoimprint techniques, a master pattern is formed by a high resolution patterning technique, such as E-beam lithography. These high resolution masters are then used to create a corresponding pattern on the IC layer without the use of an imaging step, but with some kind of stamping or printing technique. This is in principle very similar to techniques used for creating the microscopic patterns found on compact discs (CDs).

The most straightforward illustration of this was developed by Stephen Chou et. al, and is illustrated in FIG. 2. Chou's process would take the same layer to be processed 130, coated on a partially fabricated substrate 100, but coat the assembled substrate with a layer of a deformable polymer 250, as shown in FIG. 2a. The master template 210, with patterns of indentations 212 corresponding to locations where the final structures are desired, is fabricated by high resolution lithography techniques. The template 210 is then aligned over the partially fabricated substrate 100 and as shown in FIG. 2b, the two are pressed together. The deformable polymer 250 fills the indentations 212 in the master 210. The master is then removed, leaving a pattern of structures 252 on the partially fabricated substrate 100 as shown in FIG. 2c. Subsequent processing, such as etching, leaves the desired result of patterns 132 formed from layer 130, defined by the locations of the remaining material 252, as shown in FIG. 2d. Chou has demonstrated the reproduction of features as small as 10 nm using this technique.

C. Grant Willson et al. have proposed a variation on this technique as illustrated in FIG. 3. In this approach, the master 310 is transparent to ultraviolet light. This master 310 also contains indentations 312 patterned in the surface through a high resolution fabrication technique. As shown in FIG. 3a, Willson's process takes the same layer to be processed 130, coated on a partially fabricated substrate 100, but coats the assembled substrate with a layer of a deformable polymer 350 which is also sensitive to UV exposure. The transparent master 310 is pressed against the polymer 350 on layer 130 and partially fabricated substrate 100. This layer 350 deforms, filling the indentations 312 in the master 310 with material 352., while possibly leaving a thin layer 351 still between the surface of the master and the substrate. The polymer materials 351 and 352 are then cured and hardened using UV exposure 360, as shown in FIG. 3b. Then, as shown in FIG. 3c, the master is removed, and leaving thicker material 352 over the portions of layer 130. Subsequent processing, such as etching, leaves the desired result of patterns 132 formed from layer 130, defined by the locations of the remaining material 352, as shown in FIG. 3d.

A drawback to these techniques is that the master must be repeatedly used again and again in the formation of the desired material. This can lead to damage to the master through normal wear and exposure to contaminants. A common technique used to replicate diffractive structures used for gratings and other photonic devices involves the creation of replicas of a master grating. These methods involve the creation of a master from which replications are made by applying a thin vacuum deposited separation layer on the master. A metal coating is then deposited on top of the separation layer, and an epoxy coated substrate is placed on top of the layer-covered master. The combination is then cured and the process is completed when the replicated grating is separated from the master grating. This approach suffers from throughput limitations requiring vacuum depositions on the master. With this approach, the master suffers degradation only from the creation of multiple replicas; the replicas themselves are used in the actual fabrication process and are discarded when damaged.

George Whitesides et al. have developed a similar process using a replica, or template, made from poly (dimethylsiloxane) (PDMS) for applications what he calls "soft lithography". They have also developed a variation of this process using an inking technique, to minimize damage to the template. This is similar in concept to the inking of rubber stamps commonly used in other conventional printing applications.

An example of this process is illustrated in FIG. 4. The master 400 with indentations 402 itself is not used directly, but is replicated as a polymer template 410 with raised sections 412 corresponding to the indentations 402. This polymer template 410 can be used directly for imprint lithography, and discarded if damaged through reuse. To achieve the same patterns 132 from a layer to be processed 130, coated on a partially fabricated substrate 100, Whitesides' process coats the assembled substrate with a layer of a special material 450 which is selected for certain chemical characteristics. As shown in FIGS. 4a and 4b, the template 410 is formed from PDMS by coating the master 400 with the material, either through spin coating or by some other coating and curing technique. Then, as shown in FIG. 4c, the template 410 is then bonded to a carrier 430 using some bonding layer 420, and removed from the master 400.

This template 410 is then "inked" with a thin layer of special chemicals 414 such that only the raised portions 412 of the template 410 are coated with the chemical 414, as shown in FIG. 4d. The template is then aligned and placed in close contact with the partially fabricated substrate 100 with partially fabricated microdevices also coated with a layer to be processed 130 and chemical layer 450, transferring the "ink" 414 to the substrate as shown in FIG. 4e.The material for the ink 414 and the layer 450 will be chosen to react, and leave an altered layer of material 452 in locations touched by the ink 414, as illustrated in FIG. 4f. This altered material 452 serves as a barrier to the reactions, protecting the layer 130 below. Subsequent processing leaves the desired result of patterns 132 formed from layer 130, defined by the locations of the altered material 452, as shown in FIG. 4g.

Some of the problems with PDMS as a template that limit its applicability include limited resolution (about 200 nm) because of the difference in thermal expansion coefficient between the PDMS and the mold material, and limited throughput because of the time needed for curing. It also suffers from material incompatibility since it will stick to large areas of clean silicon.

In all of these fabrication techniques, the imprinting technique serves as a method for pattering a layer or film directly on the final substrate, e.g. a silicon wafer. The imprint master or template is used again and again to stamp out duplicate copies of nanostructures at low cost.

There can be undesirable consequences from using these techniques. For example, the definition of a particular layer with extremely fine structures with E-beam exposure will inherently risk irradiating the underlying layers to the electron beam as well. Care must be taken to insure that the electrical structures already created in the underlying layers are not damaged. The mechanical stamping of the master or the template onto the substrate must also be precisely controlled, or the fragile structures underneath can be strained or cracked. Keeping the master or replica free of defects as it is used again and again can also present problems.

Furthermore, processing the wafer itself layer by layer, although the standard fabrication technique for integrated circuits, may be less than optimal. For example, a metal or polysilicon layer may be best processed at a high temperature for the best results, but this degree of heating may damage or even melt the layers previously prepared on the substrate. Because all subsequent steps in the manufacture of the microdevice are deposited on the same substrate, however, these problems in process compatibility and their required compromises remain.

Some manufacturing processes in other industries avoid these problems by having separate manufacturing processes for different components, and then assembling these at a later stage of integration. The packaging of ICs is one example of such a dual process, in which the IC itself is prepared on a silicon wafer, and then cut from the wafer placed and bonded into a pre-prepared package. The preparation of the package and the IC follow two separate manufacturing processes until the bonding step is required.

Another example of this kind of dual processing or patterning is found in the common sticker. A pattern in ink is prepared on paper, plastic or some other substrate, and an adhesive applied that allows bonding to another substrate. Examples of this are very common, for example, as decorations in a scrapbook, as a label on filing cabinet, or as a statement on an automobile bumper. Clearly, forcing a large object such as an automobile bumper to fit through a printing and patterning process to attach a simple humorous message would be awkward and very expensive. The bumper sticker is far more flexible and far less expensive.

Likewise, the separation of substrate preparation and even the fabrication of microstructures can be commonly seen. Embossed holograms, such as those found on common credit cards, have structures with sizes on the same order of magnitude as the wavelength of visible light (400–700 nm). These are easily created using a printing or mechanical stamping process, and can also be prepared with adhesives. They are then and attached to many other substrates, such as credit cards, bumper stickers, magazine pages, etc. that could not be used directly in a holographic fabrication process themselves. Integrated circuits themselves are also finding application when attached directly on the surface of various "smart cards".

In a previous invention, described in US patent application entitled "Molecular Transfer Lithography" and assigned Ser. No. 09/898,521, we have disclosed an invention separating the preparation and imaging in lithographic materials, and the subsequent steps of processing the image and transferring the pattern into the final substrate. This was done by the formation of the required latent image in photoresist on an intermediate carrier. The photoresist containing the latent image is then mechanically aligned and transferred to the location on the final substrate where the subsequent processing is to occur.

This separation of processing steps allows an inventory of pre-processed latent images to be formed that can be used upon demand without delay. These latent images are typically formed on flat carriers under optimized imaging conditions. It also allows the preparation to be carried out on the carrier using an optimized process without concern for the immediate consequences on the substrate, since the substrate is not part of the process. The only concern would be the interaction of residues and the substrate once they are brought together.

Although the prior techniques reflect a great degree of innovation and creativity, and can offer significant cost advantages over conventional lithographic processing techniques, there is a need for a technique that has many or all of the advantages of a nanoimprint technique but does not have the problems associated with reusing a master or template. Furthermore, although the previously disclosed molecular transfer lithography technique addresses some of these issues, the latent image formed was generally flat and did not have topographic structures corresponding to the topography desired on the final wafers.

SUMMARY OF THE INVENTION

We disclose here a method of replicating microstructures or nanostructures from a master, processing the replicated structures, and transferring them using a dissolvable template. This dissolvable template is not reused to pattern several substrates, but is physically transferred to a substrate for pattern definition, and subsequently dissolved.

Furthermore, we disclose here a method for pre-processing materials on the replica which are then transferred to the substrate, instead of conducting all processing on the final substrate itself.

We also disclose a method of actually fabricating layers or portions of layers of a microdevice on the replica, and transferring these pre-assembled elements or nanostructures to the final substrate.

To implement this method, we create a master pattern using a high resolution lithographic technique, such as electron beam lithography, on a durable substrate, such as silicon or quartz. Typically, this master pattern will have some definition of the features to be created as variations in topography, and may be identical to the master patterns used in other nanoimprint lithography techniques.

The patterns on the master are then replicated by one of a variety of processes onto a template, supported by an intermediate carrier. The template can serve merely as a disposable replica of the master for subsequent use in an imprint lithography system, or can serve as the basis for the formation of the nanostructure elements themselves. These nanostructures may be created on the carrier through the suitable sequence of deposition, electroplate, coating, patterning, and/or etching steps. The selection of processing details will depend on the specific application for the final device. Aside from micro and nanostructures for electronic devices, the template may be used to fabricate a diffraction grating or other photonic device depending on the desired application. Other applications are micro electro mechanical systems (MEMS), superconducting devices, and biological applications involving selective patterning of protein and DNA sequences.

Once the template is attached to the carrier, the carrier can be stored until it is required for manufacturing. At that time, it is aligned to the final device substrate and facilitates the transfer of the pattern. The template may be adhered to the surface directly or may be applied using a form of imprint lithography. However, the key element of our invention is that the template is actually transferred to the substrate and the carrier removed, leaving the template on the substrate for subsequent processing. The template is destroyed by this subsequent processing.

With inexpensively made templates, this disposable template technique offers all the advantages of nanoimprint lithography, while eliminating the problems that occur through template reuse. Once the template is created, however, it is clear that additional processing can take place on the template prior to the transfer. This can be as simple as coating to aid in a possible subsequent transfer or nanoimpliant process, or the application of coatings to allow the template itself to become a optical component such as a polarizer or fresnel lens.

However, it is also possible to carry out a more elaborate sequence of processing steps on the template, actually pre-fabricating elements of components such as nanoscale wires or contacts that can be transferred directly into the final devices. These can then be transferred along with the dissolvable template, using a direct transfer from a carrier to a substrate, as part of the manufacturing process for the final device, or can be transferred as a nanoimprint process is carried out.

BRIEF DESCRIPTION OF THE DRAWINGS

FIG. 1: Processing steps for pattern formation by E-Beam Lithography (Prior Art).

FIG. 4: Processing steps for the microcontact printing of Whitesides (Prior Art).

FIG. 5: Flow chart of generic process according to the invention.

FIG. 6. Processing steps for a nanoimprint process using a dissolvable template according to the invention.

FIG. 7: Representative flow chart for additional processing on the template.

FIG. 8: Representative flow chart for the creation of nanostructures on the template.

FIG. 11: A conventional spin coating apparatus.

FIG. 13: Process steps for sputtering onto a template and a nanoimprint process using that template.

FIG. 14: process steps for preparing patterned materials on a template and transferring the patterned materials to a substrate.

FIG. 15: Process steps for preparing nanostructures on a template and transferring the nanostructures to a substrate.

FIG. 16: Alternative processing steps for preparing patterned materials on a template and transferring the patterned materials to a substrate.

Figure 1A:
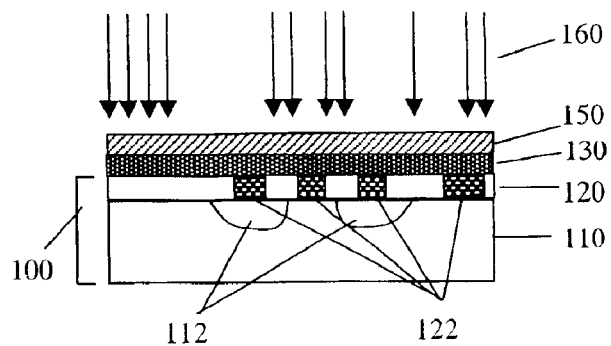
FIG. 1.
Figure 1B:
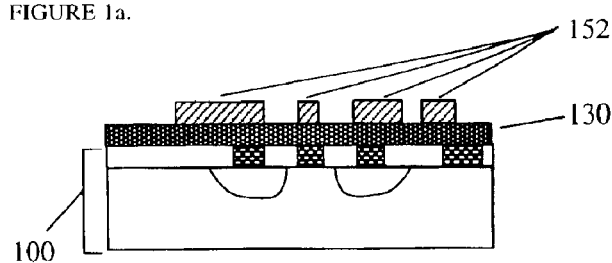
Figure 1C:
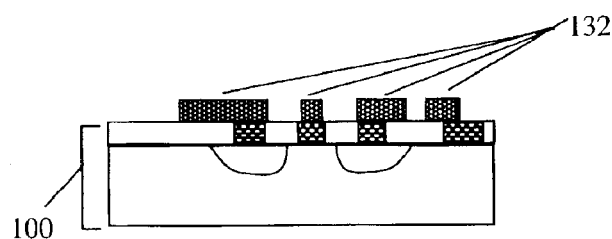
Figure 2A:
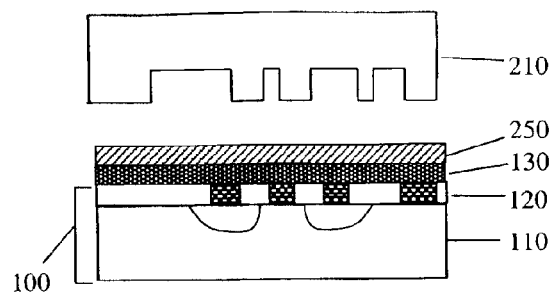
FIG. 2: Processing steps for pattern formation by the nanoimprint technique of Chou (Prior Art).
Figure 2B:
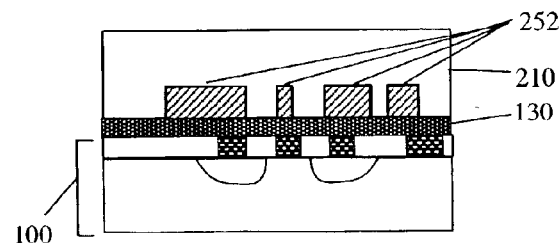
Figure 2C:
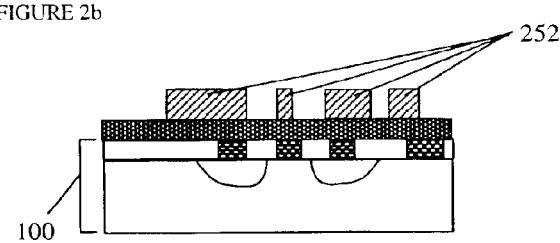
Figure 2D:
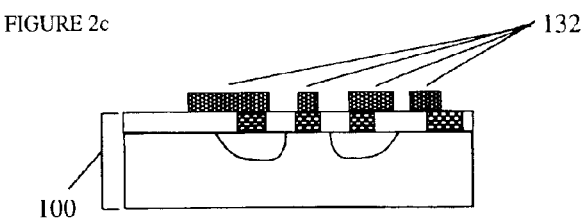
Figure 3A:
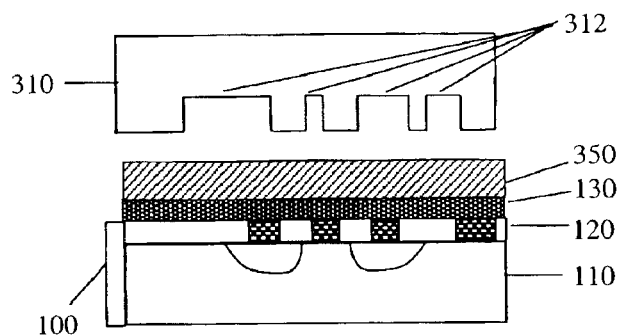
FIG. 3: Processing steps for the step and flash process of Willson (Prior Art)
Figure 3B:
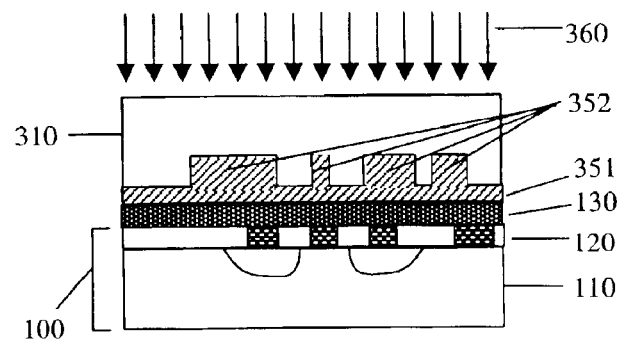
Figure 3C:
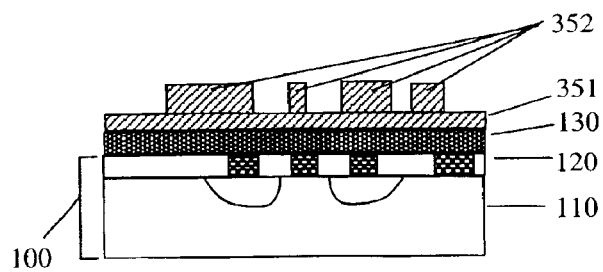
Figure 3D:
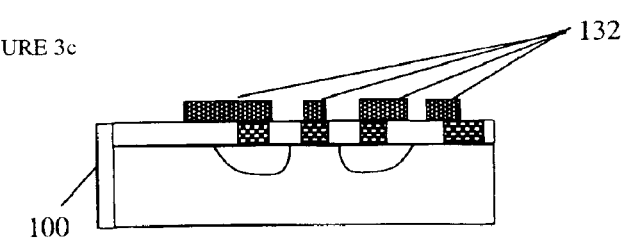

Note: All drawings in cross section are for illustration purposes only. The dimensions of the layers in these illustrations are not shown to scale, nor should any conclusion about the desired relative thickness of the layers be drawn from these illustrations.

Note: Although we have used identical numbers to represent a pre-formed partially fabricated substrate 100 and its elements, as well as layer 130 on this substrate representing the layer of material to be processed, it will be clear that any substrate with any number of preformed layers can be used with this technique.

DETAILED DESCRIPTION OF THE INVENTION

As indicated above, this represents a manufacturing technique for integrated devices using a dissolvable template that is low cost, and can be applied to nanoimprint techniques or to the pre-fabrication of portions of microdevices that are stored until their use is required. We now present a more detailed description of the best and preferred embodiments of the invention.

FIG. 5 shows a flowchart for a manufacturing process using this technique. Initially, as shown in FIG. 5a, step 500 creates a master pattern defining the layout of the structures to be fabricated. Step 510 represents the replication of the master in a template. Step 520 represents the transfer of the template to a carrier. In step 530, optional additional processing steps are carried out on the template. This is also the step where entire nanostructures or portions of other devices can be fabricated on the template. In step 540, the carrier and template, along with any structures fabricated on the template, are placed into storage.

In step 550, initial layers are fabricated on the substrate until the point is reached where the patterning corresponding to the pre-fabricated template is required. In step 560, the carrier/template is removed from storage, and in step 570 the carrier is aligned to the substrate. In step 580, the template is transferred to the substrate and the carrier removed. This step can comprise a nanoimprint transfer method, or can also comprise a simple mechanical transfer facilitated by adhesives. Finally, in step 590, the substrate and template undergo processing which destroys the template and leaves the desired patterns on the substrate.

FIG. 6 shows a more detailed sequence of steps for the most general form of the process as we have implemented it in our laboratory. The master pattern is created as raised portions 612 on a substrate material 600 as shown in FIG. 6a by a precise high resolution lithographic technique, typically using E beam lithography. Typically, material for the master 600 will be a rigid material such as silicon, although transparent materials such as quartz can also be used.

The template 600 with raised structures 612 is then created by coating the master with a conforming coating 610. A typical material for this is polyvinyl alcohol (PVA). This results in a coated master, as illustrated in FIG. 6b. This material is applied from solution by spin coating, and the resulting template 610 fills the topographic contours of the master 600 while leaving a back surface that is uniformly flat.

The template 610 is then removed from the master 600 and attached to a carrier 630, typically with a pre-formed sheet 620 to aid adhesion. The sheet 620-is connected to the carrier 630, made for example from a polyolefin sheet, with a suitable adhesive 625. The removal and attachment steps can actually be combined, by having a carrier 630 with adhesive 625 placed in contact with the back of the template 610 and removing them together.

The carrier 630 with template 610 is then stored until a microdevice on a partially fabricated substrate 100 is processed to the point where a layer 130, as shown in FIG. 6d, requires patterning using the layout corresponding to the indentations 612 on the master 600.

The partially fabricated substrate 100 with layer 130 is then prepared for transfer by coating with an deformable layer 650. This layer may be fabricated from the same material used to make deformable layers 250 or 350 in other nanoimprint processes, but can also be another material. The carrier 630 with the appropriate template 610 is removed from storage and aligned with the partially fabricated substrate 100, as shown in FIG. 6e. The carrier 630/template 610 is then pressed against the deformable layer 650 layer on the material 130 and partially fabricated substrate 100, according to normal nanoimprint techniques. The deformable material 650 deforms to fill the indentations 612 in the template 610, forming patterned material structures 652. The carrier 630 is then removed, leaving the template 610 and patterned material structures 652 behind, as shown in FIG. 6f. The partially fabricated substrate 100 with template 610 is then processed in a manner which dissolves the template 610 and sheet 620. Typically, this is by immersion in water, which dissolves PVA. After the template 610 and the preformed sheet 620 dissolve, the patterned material structures 652 on portions of the layer 130 to be patterned remain, as shown in FIG. 6g. Subsequent processing such as etching transfers this pattern to the material layer to be patterned, as shown in FIG. 6h.

FIG. 7 shows a flow chart for a variation of this process, in which additional processing steps are carried out. For this example, the optional processing step 530 from FIG. 5 comprises steps 732, 734, and 736 in which a special barrier layer or layers are coated onto the surface of the template and processed. This can protect the template 610 from contamination during storage, or have other desired chemical and physical effects. One option for the formation of the barrier layer is that the surface of the template 610 is coated with a metal, such as gold, using a sputtering system, shown as step 732. Typical coating layers are on the order of 10 nm thick, although the exact thickness will vary depending on the sputtering conditions. This can further be coated with a polymer layer in step 734 for additional protection. In step 736, the polymer layer can undergo further processing, such as planarization.

It can be seen that this process, in which the deposition of a metal layer in step 732 (in this case gold) as a barrier layer, can be altered to be create thicker structures as well. The flow chart for this altered process is shown in FIG. 8. For this example, the optional processing step 530 from FIG. 5 comprises steps 832, 834, 836, and 838 in which nanostructures are formed on the surface of the template and processed. This may be especially effective if, for example, the deposited metal is copper, and of suitable layouts and dimensions to form the interconnect layers (or portions thereof) of an integrated circuit.

In step 832, a coating of material suitable for the fabrication of the nanostructures of a layer of a microdevice is deposited on the template. This would be a material for example that corresponds to the material layer 130 used in the other examples of this application. This can be a simple deposition process, or in turn may comprise many process steps, such as the initial sputtering of a seed layer, followed by the growth of a thicker film through electroplating. In step 834, additional processing can be carried out, which can include coating the metal with a polymer. In step 836, the combined materials can be further processed, e.g. with an etching or polishing process, so that certain portions of the coated metal are then exposed, while other portions are remain protected. An additional step 838 may then also be executed to protect the exposed material for storage.

Once created, these micro or nanostructures are transferred along with the dissolvable template in step 580. This step can comprise a nanoimprint transfer method, or can also comprise a simple mechanical transfer facilitated by adhesives.

We now describe each of these steps in more detail.

Creation of the Master

The initial step in this process is the creation of the original master containing the layout pattern. The essential element in the patterning of the master is that it comprises a layout of the structures to be replicated in a reproducible form. This is most simply done by forming the layout as a relief pattern on a rigid substrate. The relief pattern can be created by patterning and selectively etching a rigid material, such as a silicon wafer, or by patterning a material deposited on the rigid substrate, such as a chrome/chrome oxide layers on quartz (a conventional photomask blank). Although a disc shaped master has certain advantages for processing, masters of other shapes, such as squares, rectangles, hexagons, octagons, etc. can also be used.

Figure 9A:
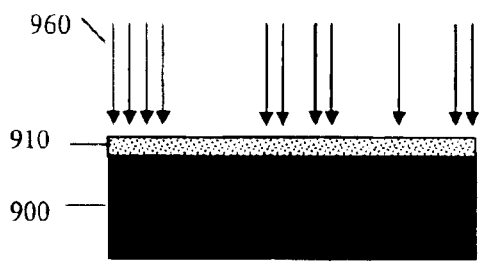
FIG. 9: Processing steps for the preparation of masters.
Figure 9D:
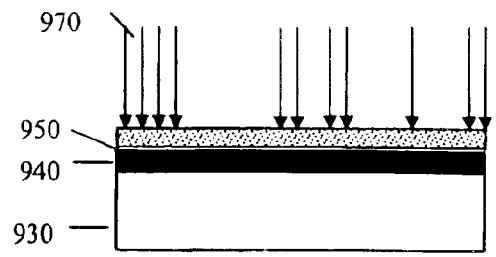
Figure 9B:
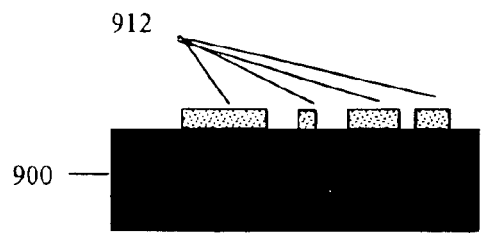
Figure 9E:
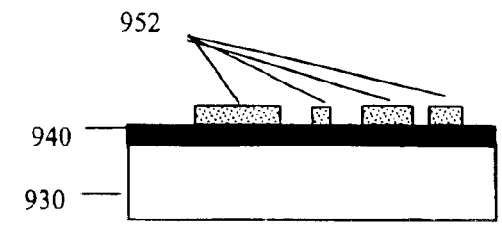
Figure 9C:
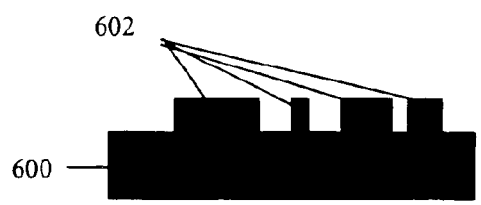

The master can be fabricated using conventional microfabrication or nanofabrication techniques. The preferred method involves the use of a direct-write E-beam lithography system to expose patterns in photoresist on a silicon wafer, because of its high reliability and high resolution. This is illustrated in FIG. 9. In this process, an unpatterned material 900 (also sometimes called a "blank" is coated with a layer 910 polymer material, commonly called a resist, sensitive to electron beam exposure. The sensitive layer 910 is then exposed to patterns of electron beams 960, where the geometric arrangement and dose defines the pattern to be formed, as shown in FIG. 9a. The exposed material of layer 910 is then chemically processed, or developed, and, the unexposed regions 912 are left on the substrate, as shown in FIG. 9b. These serve as protection for portions of the blank 900, so that after subsequent processing, for example by etching, the protected portions remain as raised portions 602 while the rest of the material surface has been etched. This creates a master 600 with topographic structures 602 corresponding to the layout pattern of the exposure 960, as shown in FIG. 9c.

There are alternatives to electron-beam lithography to create a master with relief for replication. For example, one could use an optical lithography system with a mask to expose the initial pattern. Other methods include EUV or x-ray lithography or nanoimprint lithography. In fact, any lithographic technique could be used to fabricate the master as long as the process had suitable resolution and accuracy.

Although silicon is a convenient material to use for the master, there are many materials that could be used for the master other than silicon. Semiconductors that have well known patterning processes such as silicon, germanium, GaAs, SiGe, Silicon-on-insulator (SOI), GaN, GaP, InP, etc. can also be used as blanks. Metals such as stainless steel, iron, copper, or aluminum could also be used as blanks. Since only the topographic structure on the substrate is transferred, one could coat any rigid material with a polymer such a photoresist, expose and develop the photoresist, and use the resulting relief pattern as the master rather than go through the subsequent etching and stripping steps for the blank material. There are many well known processes for photoresist that can leave topographic profiles of various kinds.

Figure 9F:
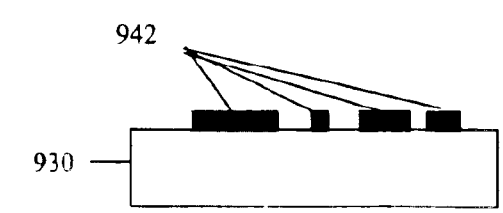

Another material suitable for a master are quartz or glass plates coated with chromium/chrome oxide materials that form the opaque layer of a conventional photomask. This can be especially useful if a subsequent step requires exposure through the master for UV curing. This is illustrated in FIG. 9 as well. An unpatterned material 930 coated with a layer of opaque material 940 (in this case, the combination of 930 and layer 940 is sometimes called a "blank") is coated with a layer 950 of a polymer material, commonly called a resist, sensitive to electron beam exposure. The sensitive layer 950 is then exposed to patterns of electron beams 970, where the geometric arrangement and dose defines the pattern to be formed, as shown in FIG. 9d. The exposed material of layer 950 is then chemically processed, or developed, and the unexposed regions 952 are left on the blank, as shown in FIG. 9e. These serve as protection for portions of the layer 940, so that after subsequent processing, for example by etching, the protected portions remain as raised portions 942 while the rest of the material surface has been etched. This is illustrated in FIG. 9f. This creates a master 930 with topographic structures 942 in opaque material corresponding to the layout pattern of the exposure 970.

Typically, the layer 940 can be manufactured from a mixture of chrome and chrome oxides typically and sold as photomask blanks. However, other materials, such as aluminum or gold, could also be chosen as ingredients in layer 940 for their particular thermal, electrical, or chemical properties. Likewise, the underlying substrate material 930 of a photomask blank is typically quartz, but other transparent materials such as glasses, hardened polymers, or transparent crystals such as CaF2 can be used for substrate 930 as well. For situations sensitive to dimensional change from temperature control, a material with a low thermal expansion coefficient such as Zerodur can be used for the substrate 930. One could also form or coat a thin-film material on top of the relief pattern to aid in subsequent processing steps.

The relief pattern can also be created by etching the rigid substrate of a quartz master directly. This can be done using commonly used lithography techniques for photomasks, and etching procedures to create topographic structures for phase-shifting masks. Such processing steps can be based on wet etching, in which the exposed surface is selectively removed through a reaction with a liquid chemical such as the quartz etchant hydrofluoric (HF) acid, or a dry etching procedure such as reactive ion etching (RIE) in a suitable plasma chamber. Other etchants specific to various other rigid substrate materials, such as the semiconductor materials listed above, can also be used.

It may be desirable to have a multi-level master, in which the several levels of topography are defined. This is illustrated in FIG. 10. This can be accomplished through a second set of lithographic exposure and development steps. Although E-beam lithography may be the preferred technique, it is easily recognized that any lithographic patterning step that can be aligned with the initial set of structures can be employed as well.

Figure 10A:
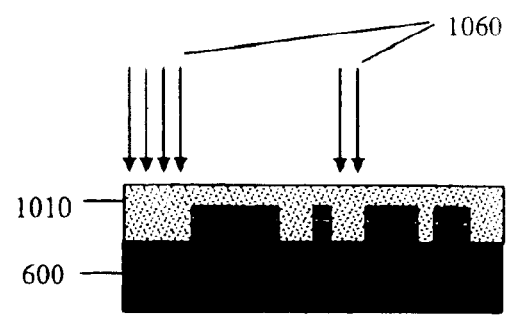
FIG. 10: Additional processing steps for the preparation of a multilayer master.
Figure 10B:
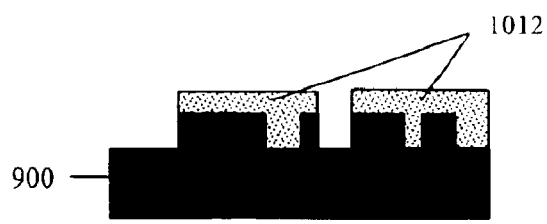
Figure 10C:
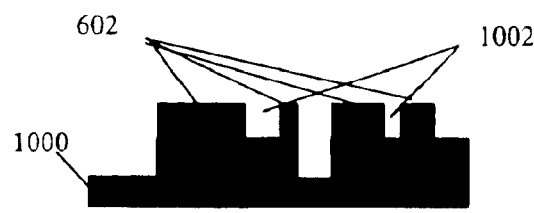

An example of this sequence is shown in FIG. 10. For this process, the original steps shown in FIGS. 9a–9c are executed to create a master 600 with a set of topographic patterns 602. This master 600 is then coated with another layer of a sensitive polymer 1010, commonly called a resist, sensitive to electron beam exposure. The sensitive layer 1010 is then exposed to a second pattern of electron beams 1060 as shown in FIG. 10a, where the geometric arrangement and dose defines the second pattern to be formed. The exposed material of layer 1010 is then processed, or developed, and the unexposed regions 1012 are left on the master 600, as shown in FIG. 10b. These serve as protection for portions of the master 600, so that after subsequent processing, for example by etching, the protected portions 602 and protected indentations 1002 remain unaffected while the rest of the material surface has been etched. This creates a master 1000 with multi-layer topographic structures, as shown in FIG. 10c.

Although this has illustrated only a two-step process, it will be clear that this can be applied an indefinite number of times, with an indefinite number of arbitrarily defined layouts.

Although we have practiced this invention with masters formed on rigid substrate materials, it is clear to those skilled in the art that various degrees of rigidity may be allowed for different fabrication tolerances, and that flexible substrates with topographic structures may also be prepared to form masters for certain applications.

It will also be clear that any lithographic technique amenable to multiple exposure can be employed here as well. Although we have patterned our masters using silicon wafers and conventional e-beam lithography, extremely high resolution structures (e.g. 10–100 nm in size) can be obtained using X-ray lithography, EUV lithography, and even variations of optical lithography with a suitably high NA and the application of various resolution enhancement techniques. Even nanoimprint techniques can be used to fabricate the master.

Replication of the Master and Creation of the Template

Once the master has been created, the template that replicates the structures on the master must be created. This can be done by a variety of molding techniques, most of which comprise pouring a liquid on top of the master and allow the material to dry or harden. The main requirement is that the material be able to adequately fill the nanoscale topography structures on the master without the formation of bubbles or other voids between the master and the coating. Other desired properties include the ability to smoothly detach a smooth detachment from the mold, and the ability to prevent the introduction of foreign substances, i.e contaminants such as dust, that may introduce flaws. Still other desired properties include the ability to smoothly detach the template from the mold quickly for high throughput, and the ability to dry the mold without introducing thermal or mechanical distortions as part of the drying or curing process for good yield.

Many techniques can be used for this purpose, including spin coating, spray coating, droplet injection, puddle formation, electrodeposition techniques, etc. Spin coating has proven a very effective technique for creating thin conforming films. Typical spin coating is illustrated in FIG. 11. For spin coating, the master 900 is mounted on a chuck 1120 using a vacuum system 1110. A housing 1100 containing a motor spins the chuck and the master at various speeds, typically a few thousand RPM. Liquid material or solutions 1130 of the material to be molded can be poured from a container 1140 onto the surface of the spinning master. Excess material 1150 is thrown off the spinning master by centrifugal forces, leaving only a thin layer on the surface of the master. The residual solvent in this layer quickly evaporates, leaving only a thin layer of the molding material.

Alternatively, if a liquid material is used, spin coating may be used to create a uniform conformal coating, and the casting material may be polymerized or hardened with subsequent processing, or with reactions with the oxygen or other ambient gasses.

A material we have found that works well with this technique is polyvinyl alcohol (PVA). PVA is a water soluble compound, and so solutions can be created using purified water. Typical solutions can be obtained from a distributor such as Fiberlay of Seattle, Wash., USA, and sold under the brand names of Fiberlease or Partall Film #10 manufactured by Rexall. We have found the material of Fiberlease to work exceptionally well. The concentrations of Partall Film #10 in the Rexall MSDS are water (56–61%), ethyl alcohol (31–34%), Acetic Acid Ethenyl Ester, Polymer with Ethonol (7–8%), and butyl alcohol (1–2%). The material is usually used as a release layer for molding applications.

The PVA solution is then poured onto the spinning master, using for example spin speeds of 1800 RPM and 15 seconds on a conventional spin coater. If thicker films are desired, the procedure may be repeated, or slower speeds may be used. The resulting structures conform very well to the topographic structures on our masters, even for dimensions as small as 40 nm laterally. We have found that the three-dimensionally replication ability is excellent, that is the ability to replicate the pattern in the vertical dimension replicated to within 20 nm of 100 nm steps, and perhaps better, limited by our present ability to measure. The ultimate lateral resolution we have observed is not limited by the PVA, but rather by our ability to reliably fabricate structures this small in the master. Smaller structures can clearly be created in PVA.

An additional property of the PVA film is that, while the surface in contact with the master conforms to the topography of the master, the remaining film can be thick enough that the top surface remains uniform, i.e. does not vary with the underlying topography. The thickness can be adjusted by varying the concentration of the solution, by using solvents with different vapor pressures, by changing the spin speed, or by controlling the properties of the environment in which the coating takes place. Maintaining a contaminant free environment with temperature and pressure control allowing the best solvent evaporation conditions is important for ideal replication of the structures on the master.

Once the conforming layer has been created on the master, it must be removed. For thicker PVA films, the layer can simply be peeled off. This free-standing film, however, is usually only a few tens of microns thick, and can be delicate and difficult to store control.

Figure 12A:
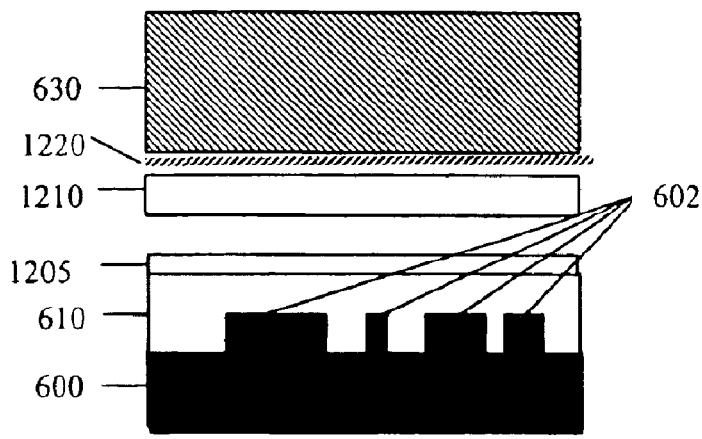
FIG. 12: Processing steps for using a pre-formed disk.

Consequently, we have also used pre-formed discs of PVA to assist with the removal of the spin-coated PVA from the master. Pre-formed discs of PVA are commercially available from companies such as Shercon, Inc., of Santa Fe Springs, Calif. A process using these is illustrated in FIG. 12. In FIG. 12a, a master 600 with topographic structures 602 has been coated with a PVA film 610 by spin coating. This master is shown as being the master 600 of FIGS. 6 and 9, but can also be replaced by any master, including those shown as 1000 in FIG. 10. A pre-formed disc 1210 of PVA mounted to a carrier 1230 with a suitable adhesive 1220 is then aligned with the master. This disc 1210 can be manufactured using a casting method on a flat surface, for example. Such a disc is generally packaged with an adhesive backing 1220 connecting the disc 1210 to a clear plastic flexible sheet, which can be used as carrier 1230. This form is convenient for removal of the molded PVA from the master 900.

Figure 12B:
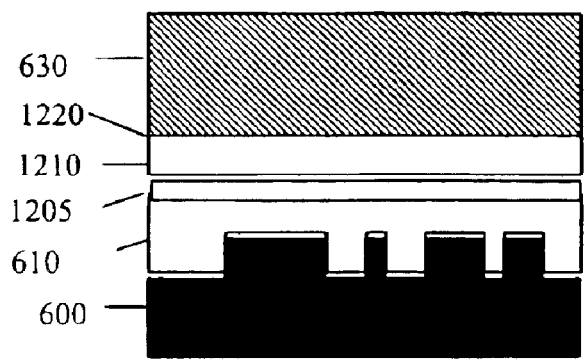
Figure 12C:
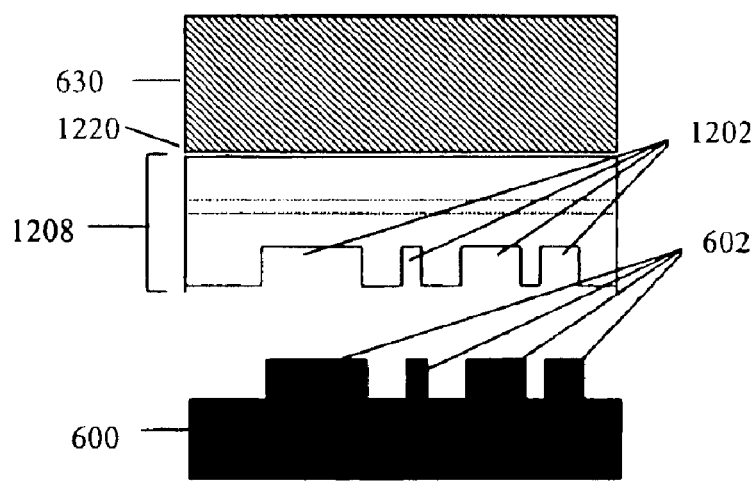

In this embodiment of the invention, a master 600 coated with an initial dried film of PVA 610 is again spin-coated again with an additional layer of PVA 1205. Immediately, before the solvent is completely dried from the additional layer 1205, the pre-formed PVA disk 1210 mounted to the carrier 1230 with an adhesive 1220 is placed on the master 600 coated with PVA 610, as shown in FIG. 12b. After a drying period of a minute or more, the structures 610, 1205, and 1210 bond together, forming structure 1208. This dried structure 1208 is removed from the master, producing the result shown in FIG. 12c. This dried structure 1208 will have topographic structures 1212, which are similar to the structures 612 in FIG.6, that correspond to the topographic structures 602 in the master 600. Dried structure 1208 would similarily correspond to the pair of structures 610 and 620 shown in FIG. 6.

More generally, the carrier 1230 need not be a polymer film, but can be any material with a flat surface of the size and shape suitable for the size and shape of the layout on the master is created. This can be made from metal, quartz, a polymer, or any other material that can be stored without contaminating the film once transfer has occurred. Any solid and/or flexible material can serve this purpose, as long as it is coated with a suitable adhesive 1220 that allows the PVA coating to be removed from the master.

Creation of Structures on the Template

Once the PVA film that replicates the topography on the master has been created and attached to a carrier, material processing on this replicated structure or template can be carried out. This can be one of a variety of steps and will depend on the application.

The requirements for the subsequent processing on PVA is that (1) no reaction occurs with the PVA film, and (2) the processing steps not exceed a thermal decomposition temperature of the PVA film, roughly 230 C. Other template materials may have other physical and environmental requirements, depending on their material properties.

In one application, the PVA film may be coated with a metal film. This may be a simple coating to protect the template from contamination or decay.

A common process operation that works well with PVA is sputtering or evaporation of metal films. This is illustrated in FIG. 13. In a sputtering system, typically in a well controlled vacuum environment 1399, a target 1390 of the material desired provides a source for atoms or particles 1392 of the material to be deposited as a layer 1302 on the surface of the template 1208, mounted to a carrier 630. This is illustrated in FIG. 13a.

Once the film has been created, the carrier 630 with the template 1208 and film 1302 is removes, and can later be used for normal imprint lithography, as illustrated in FIGS. 13b–e (similar to the steps shown in FIG. 6).

Sputtering tools are commonly available in processing labs, such as the Stanford University Nanofabrication Facility, or can be obtained commercially such as the sputter coater from Cressington Scientific Instruments, Inc., and distributed by Ted Pella, Inc. We have sputtered materials onto topographical PVA that include gold, copper, aluminum and chrome using simple sputtering tools. Other materials that can be sputtered or evaporated onto PVA include tungsten, Palladium, Platinum, Nickel, Nickel-Chromium. One can also evaporate materials such as Carbon. One can also perform a co-evaporation of superconductor materials such as Yttrium, Barium, and Cobolt.

Other methods of depositing films other than by evaporation/sputtering and still satisfy the requirements include chemical vapor deposition by hot filament methods. In these techniques, organic films can be deposited by passing an organic precursor vapor through a hot filament where it undergoes thermal fragmentation. The subsequent vapor products deposit in solid form on the PVA surface. With this method it is possible to keep the PVA at a low safe temperature during the film forming process. This method is commonly referred to as solventless deposition of photoresists, such as PMMA (poly methyl methacrylate).

Another method is through plasma enhanced chemical vapor deposition (PECVD) of thin films as long as the surface temperature is below the decomposition temperature of PVA. PECVD films are oxides, nitrides, oxynitrides, polysilicon, fluropolymers, and so forth.

Spin-coating of materials onto the PVA topographical can also be performed provided that the liquid not react or dissolve the PVA structure. Hence the material selection is limited to generally hydrophobic materials such as fluorine based compounds, for example, that do not have solvents that will react with PVA.

Further Processing of Structures on the Carrier

It may also be possible desirable to perform additional processing on the template. The layer on top of the PVA relief provides a convenient coating for the further development, and aids in flexibility since the subsequent processing steps will not interact directly with the delicate PVA material.

It may be desirable, for example, to use the PVA relief structures to actually preprocess a photoresist material. This material would then be transferred, along with the template, to the final substrate. To create a planar surface, at least two approaches may be used. The first involves spin-coating or depositing using other means an organic etch-resistant material such as photoresist on the barrier layer 1302. This material can form a thick coating that may be thinned using subsequent etching techniques.

This is illustrated in FIG. 14. In this FIGURE, a barrier layer 1302 is created from a sputtering source 1390 on a carrier 630 with a template 610 having indentations 612 as previously described, as shown in FIG. 14a. After the deposition of the barrier layer 1302, the carrier is then mounted on a spin coating apparatus and coated with an additional layer 1440 of a polymer photoresist, with the result shown in FIG. 14b. This is then partially etched so that the indentations in the template 612 are now uniformly filled with the remaining portions of the photoresist 1442, while the metal layer 1302 is exposed on the regions of the template that correspond to the etched portions of the master 600, as illustrated in FIG. 14c.

In subsequent processing steps, the carrier 630 with these photoresist portions 1442 filling indentations 612 in the template 610 is aligned with a substrate 100 that has been partially manufactured and coated with a layer of material 130 to be patterned, as shown in FIG. 14d. These are then brought together in close proximity and pressed together. Layer 130 may be coated with an additional layer of material 1462 to promote adhesion. The carrier is then removed, with the result shown in FIG. 14e.

The partially fabricated substrate 100 with layer 130 and template 610 is then processed in such a manner that the template dissolves, leaving only the portions of the photoresist 1442 on the surface of the layer 130 to be processed, as shown in FIG. 14f. This acts just as the portions of resist 652 in the previously described embodiments of the invention for the subsequent processing of the partially fabricated substrate 100, to produce the result shown in FIG. 14g, where portions 132 of the layer 130 remain.

It is clear that this additional processing can also comprise the creation of entire portions of nanostructures for microdevices, as long as a suitably reliable transfer mechanism is developed. In this case, the material deposited can be a much thicker layer, and additional processing steps can also be carried out as well.

Although such a layer can be fabricated entirely by sputtering techniques, another approach is to use a thin layer of sputtered metal as a seed layer, and then perform electroplating techniques to create a uniform film. Such electroplating techniques are useful with copper, aluminum, and gold seed layers.

One advantage that this technique has over other fabrication techniques for layers of microdevices is that the creation of this individual layer is independent of the layers that normally precede it in the fabrication process. This allows additional processing of this layer, and especially processing that might be incompatable with previous processing steps for the device, to be an option at this point.

Such optional processing can comprise an annealing step for a metal, sputtering of material mixtures for specific properties, creation of multiple layers with dimensions controlled for their anti-reflective optical properties, or the creation of a sequence of proteins for a biochip array. With the suitable choice of template and carrier material, processing at temperatures or under conditions not tolerated by the previously fabricated device layers can be done with impunity, as long as the process is compatible with the disposable template material.

This is illustrated in FIG. 15. In this case, if patterns equivalent to the master 600 of the previous example is to be achieved, the template 1510 must actually be inverted, that is, having raised areas 1512 corresponding to the indentations 612 of the previous templates 610.

A thin layer 1501 of the material to be processed is created from by sputtering from a target 1590 made from that material, as shown in FIG. 15a. This is subsequently electroplated to form the thicker layer 1502 shown in FIG. 15b. Additional processing steps can also be used to obtain a suitable deposit of the desired material.

Typically, this is then coated with a layer of a polymer 1540, which is then processed by etching or polishing to expose only the raised portions 1512 of the film 1502, while leaving leftover material 1542 from the polymer film 1540 in the indentations, with the result shown in FIG. 15c. The structures 1512 are essentially pre-fabricated layer of nanostructures that would normally have been created as the structures 132 on a partially fabricated substrate 100. This prefabricated structure is then stored until needed.

After a partially fabricated substrate 100 has reached the point in its manufacture where this layer is required, the template 1510 with nanostructures 1512 and carrier 630 is removed from storage and aligned with the partially fabricated substrate 100, as shown in FIG. 15d. An adhesive coating 1562 on the partially fabricated substrate 100 may be used for better attachment of the nanostructures 1512 on the template. The carrier and template 1510 are then brought into close proximity and pressed together, as shown in FIG. 15e. The carrier is then removed, with the result shown in FIG. 15f.

The template is then dissolved, leaving only the polymer and the metal. Subsequent processing can also remove the polymer material and the excess portion of layer 1502, leaving only the portions 1532 of that correspond to the nanostructures desired in the device. These would, for example, correspond in size and shape to the structures 132 shown in the other figures.

An alternative process is shown in FIG. 16. Here, a thin layer 1601 of the material to be processed is created from by sputtering from a target 1590 made from that material, as shown in FIG. 16a. This is subsequently electroplated to form the thicker layer 1602 and coated with a polymer 1642 to fill the indentations 612 as shown in FIG. 16b. This filling can be achieved by overfilling and etching or polishing the film, although other planarization techniques will be known to those skilled in the art. Additional processing steps can also be used to obtain a suitable deposit of the desired material.

This structure can then be further polished or etched to remove all but the portions 1632 of film 1602 that filled indentations 612, with the result shown in FIG. 16c. The structures 1632 are essentially pre-fabricated layer of nanostructures that would normally have been created as the structures 132 on a partially fabricated substrate 100. This prefabricated structure is then stored until needed.

After a partially fabricated substrate 100 has reached the point in its manufacture where this layer is required, the template 610 with nanostructures 1632 and carrier 630 is removed from storage and aligned with the partially fabricated substrate 100, as shown in FIG. 16d. An adhesive coating 1660 on the partially fabricated substrate 100 may be used for better attachment of the nanostructures 1632. The carrier 630 and template 610 are then brought into close proximity and pressed together. The carrier 630 is then removed, with the result shown in FIG. 15e.

As a final step, the partially fabricated substrate 100 and template 610 with nanostructures 1632 are processed so that the template 610 dissolves, leaving only the nanostructures 1632 in specific locations on the partially fabricated substrate 100. This corresponds to the structures 132 formed on the partially fabricated substrate 100 in other processing sequences disclosed in this application.

Although we have originally conceived this as a technique for the prefabrication of layers or nanostructures for integrated circuits, this can apply to any technology which requires a patterning or lithographic technique. For integrated optical applications, certain dopants for altering fused silica waveguides may be pre-patterned and placed on the template. For biochip applications, certain proteins or DNA strands with specific sequences may be attached to the template and stored.

Storage of the Template

Once the material structure of the layer has been created on the template, it can be stored until it is needed. Although this may be only a few minutes, creating inventories of prefabricated device layers can avoid the queuing problems associated with "traffic jams" in wafer fabrication, and template and carrier properties, as well as the storage environment, should be chosen for chemical stability, as well as to minimize contamination from outgassing, to reduce physical deformation from temperature fluctuations, and to generally preserve the material on the template and carrier indefinitely.

Typically, the template will be enclosed in a sealed container, with controls for temperature, humidity, atmospheric content and pressure, and other variables controlled with the goal of maintaining mechanical and chemical integrity of the template and the structures fabricated on it.

The template or replicated structure may also be adhered, frontside down, to a glass or silicon disc as part of the storage process. The disc provides a more rigid support and can be utilized within a typical bonding or aligning tool as part of the transfer process. The adhesive in this case may be a water soluble glue, for example, such as polyvinyl alcohol. This adhesive would permit the effect separation of the replicated pattern from the hard support during the transfer procedure. The solid structure may then be placed into the solid container for transportation.

The template or replicated structure may also be adhered, backside down, to a glass or silicon disc as part of the storage process. This would allow the components to be faceside up during the transfer process.

It may also be desirable to dice the template into individual components or chips as part of the storage procedure. The dicing process enables more precise placement of the fabricated piece during the transfer to the final substrate.
Transfer of the Nanostructures to the Substrate.

Once there is a substrate that requires the transfer of the particular pattern replicated on the carrier, the suitable carrier is removed from storage. The surface of the substrate is prepared, if necessary, with a suitable adhesion promoter layer 1462 or 1562 made from a suitable material such as cyanoacrylate ester. This can be done using a simple deposition technique, such as applying drops of liquid onto the surface from a nozzle, or using a more uniform spin coating technique. Other adhesive materials, such as epoxies, acrylics, polyurathanes, photoresist, polyimides, low-k dielectrics, silicon dioxide, aluminum oxide, PZT, P(L)ZT, Ruthenium oxide, barium titanate, barium strontium titanate, cadmium oxide, hafnium oxide, indium tin oxide, lead titanate, lead zirconate, tantalum pentoxide, titanium oxide, tungstun oxide, zinc oxide, FSG, HSQ, HOSP, SILK, FEARE, PAE-2, probromide, paralene, PTFE, xero-gel, nano glass, and bizbenzocyclobutane, can also be used. When transferring nanostructures themselves instead of a pattern, some residue of this adhesion layer will typically remain between the substrate and the nanostructures, so care must be taken to insure that this residue is compatible with the material being transferred, and that the desired properties (e.g. electrical contact, etc.) of the interface be maintained.

Actual transfer of the patterned layer, or of the nanostructures themselves from the carrier to the substrate can occur in a number of ways. Pressure can be uniformly applied from one side, or pressure can start from one corner and be successively applied over the surface to insure air bubbles are not trapped between the carrier and substrate. Pressure can be intermediate or pressure can be applied and held for some period of time. High pressure may be required to insure good contact and uniformity. Adhesives that bind with pressure can be used, with the suitable application of pressure. Adhesives that bind with heat can be used, with the suitable application of heat. Adhesives that bind with UV photoexposure or curing can be used, along with the suitable application of UV exposure.

Once this step is finished, the template will adhere to the substrate, and the carrier itself can be removed. Because the patterning material (e.g. gold and polymer for our example) remains attached, the template can now be removed, leaving these other atructures attached to the substrate. For our example of PVA as a template material, this can be accomplished by simply dissolving the PVA from the surface with purified water. For other template materials, other solvents may be suitable. Additional steps of mild abrasion or wiping may also be used to selectively remove the template material, while leaving behind the metal and polymer combination.

Now that a patterned structure has been placed on the surface of the substrate, subsequent processing steps of deposition, etching, doping, or other chemical treatments can take place just as they would in any other printing technique.

Additional methods of adhesion can be deployed from the area of wafer bonding. Some methods include the thermal fusion of metal to metal or anodic bonding. In the case of gold barrier layer contacting the silicon surface. An initial adhesion of the PVA-metal layer is achieved by long-range forces. After the PVA is dissolved, the material structure may then be heated to high temperature to form a eutectic bond between the metal and silicon surface.

Another method involves directly heating a metallic interface between the template and substrate using an energetic laser beam. This forms a weld between the template and substrate upon cooling.

When the nanostructure itself has been fabricated on the template and transferred the adhesive layer on the substrate must be carefully chosen so that electrical properties are not impaired and good electrical contact with the substrate is achieved. Care must also be taken to align all the overlapping structures exactly. Although the alignment and transfer of several thousand or even millions of pre-fabricated metal nanostructure wires may be hard to achieve with good repeatability, there are applications (the repair of a single IC, for example), where the placement of a single nanowire can add value for an IC.

It will also be understood that the metal coated template or polymer coated template can also be used as a master itself in subsequent processes, including those found in the prior art nanoimprint techniques. In this case, the template is not destroyed, but again replicated, and the replicas can be used and destroyed without damage to the template.
Alignment of the Carrier and Substrate To align and transfer the smooth template onto the substrate, standard wafer aligners and bonders are useful. Examples of commercially available aligner equipment that can be used to transfer the pattern onto the substrate include the EVG620 sold by the EV Group of Austria. Bonding equipment that can be coupled include the EVG520 bonder sold also by the EV Group. In this approach, alignment marks are recorded of the template. The gold or organic coating relief image creates sufficient contrast to determine the position of the template relative to the substrate. After recording the relative positions, servos manipulate the substrate to align and contact the template. A vacuum assisted bond helps to remove air bubbles between the template and substrate.
Additional Processing Options.

Further processing steps may be added to the above sequence to form specialized structures. It is possible to form a latent image on top of the PVA contoured metal surface replica prior to removal from the master surface.

It is also possible to develop the latent image pattern on the contoured metal surface. Subsequently, additional PVA solution may be spin-coated onto the developed pattern to form a multilayer structure of metal and organic material. The combined structure may then be removed from the surface of the master using the aforementioned techniques. The structure may then be transferred onto a second substrate or used directly.

While specific materials, coatings, carriers, substrates, and process steps have been set forth to describe and exemplify this invention and its preferred embodiment, such descriptions are not intended to be limiting. Modifications and changes may be apparent to those skilled in the art, and it is intended that this invention be limited only by the scope of the appended claims.

I claim exclusive property and privilege over the following:

1. A method for pattern formation comprising:
    creating a replica of a master pattern;
    transferring the replica onto a substrate comprising material to be patterned; and
    destroying the replica while it is in contact with the substrate.
2. The method of claim 1, in which
    the replica can be dissolved in a solvent, and
    the step of destroying comprises dissolving the replica in said solvent.

3. The method of claim 2, in which
the replica is fabricated from polyvinyl alcohol (PVA), and
the solvent is an aqueous solution.

4. The method of claim 1, in which
the step of destroying comprises etching the replica.

5. The method of claim 1, in which
the step of creating the replica comprises spin coating of the replica material from a solution onto the master.

6. The method of claim 1, in which
the step of creating the replica comprises casting a liquid polymer on the master.

7. The method of claim 5 or 6, in which
the step of creating the replica also comprises drying the liquid polymer.

8. The method of claim 5 or 6, in which
the step of creating the replica also comprises UV curing of the polymer.

9. The method of claim 5 or 6, in which
the step of creating the replica also comprises heating the polymer.

10. The method of claim 1, comprising an additional step of
removing the replica from the master, and
attaching the replica to a carrier.

11. The method of claim 10, in which
the carrier is coated with a material to promote adhesion to the replica.

12. The method of claim 10, in which
the replica is coated with a material to promote adhesion to the carrier.

13. The method of claim 11 or 12, in which
the adhesion promotion material comprises polyvinyl alcohol (PVA).

14. The method of claim 11 or 12, in which
the adhesion promotion material comprises the same material as the replica.

15. The method of claim 10, further comprising the additional step of
storing the replica and carrier.

16. The method of claim 15, in which
the storage environment is controlled for temperature.

17. The method of claim 15, in which
the storage environment is controlled for humidity.

18. The method of claim 15, in which
the storage environment is controlled for pressure.

19. The method of claim 15, in which
the atmosphere of the storage environment is controlled for chemical composition.

20. The method of claim 15, in which
the replica is inserted into a protective package during storage.

21. The method of claim 10, in which
the step of transferring comprises aligning the carrier to the substrate.

22. The method of claim 10, in which
the step of transferring comprises touching the replica against the substrate.

23. The method of claim 22, in which
the step of transferring comprises pressing the replica against the substrate.

24. The method of claim 22, in which
the substrate is coated with a material to promote adhesion of the replica.

25. The method of claim 24, in which the adhesion promotion material comprises a cyanoacrylate ester.

26. The method of claim 22, in which
the substrate is coated with a deformable material.

27. The method of claim 26, in which
the deformable material is a polymer.

28. The method of claim 26, in which
the deformable material is a photoresist.

29. The method of claim 26, in which
the deformable polymer is the material to be patterned.

30. A method for forming a pattern on a substrate, comprising:
spin coating a polymer film onto a master comprising topographic patterns, such that the polymer film replicates the topographic structures of the master;
transferring the polymer film to a carrier;
aligning the carrier carrying the polymer film to a substrate which comprises a material to be patterned;
transferring the polymer film to the substrate, in a manner such that the polymer film transfers the topographic pattern of the polymer film to the material to be patterned; and
dissolving the polymer film while it is attached to the substrate.

31. The method of claim 30, in which
the polymer used to form the polymer film is polyvinyl alcohol.

32. The method of claim 30, comprising an additional step of
storing the carrier with polymer film for some time before transferring the replica to the substrate.

33. The method of claim 10, comprising additional steps of
forming a barrier layer on the replica after the replica is removed from the master.

34. The method of claim 33, in which
the material for the barrier layer comprises gold.

35. The method of claim 34, in which
the step of forming the barrier layer comprises deposition of gold on the replica using a sputtering process.

36. The method of claim 33 or 35, comprising an additional step of
forming an additional barrier layer of polymer on the replica.

37. The method of claim 36, in which
the polymer barrier layer is subsequently etched.

38. A method for forming a patterned layer of material on a substrate, comprising
preparation of a master with topographic structures in a layout that corresponds to a desired pattern;
coating the master with a polymer film;
curing the polymer film in a manner that forms topographic structures in the film that replicate at least a portion of the topographic patterns of the master;
transferring the polymer film from the master to a carrier;
processing the polymer film with a sequence of steps that leave solid materials on certain portions of the topographic structures of the polymer film that correspond to the desired pattern;
aligning the polymer film with solid materials to a substrate;

bringing the polymer film with solid materials and the substrate into close proximity; and transferring the solid materials from said certain portions on the polymer film to the substrate.

39. The method of claim 38, in which the sequence of steps that leave solid materials comprises sputtering a material.

40. The method of claim 39, in which the composition of the material to be sputtered is selected from the group containing gold, platinum, palladium, copper, aluminum, chromium, nickel, silicon, germanium, tungsten, silver, yttrium, barium, cobalt, and carbon.

41. The method of claim 38, in which the sequence of steps that leave solid materials comprises electroplating.

42. The method of claim 41, in which the sequence of steps that leave solid materials comprises sputtering a layer of material, followed by a step of electroplating using additional material of similar composition as said layer of material, such that the dimensions of the layer of material increase.

43. The method of claim 38, in which the sequence of steps that leave solid materials comprises spin coating a second polymer.

44. The method of claim 43, in which the second polymer is a photoresist.

45. The method of claim 44, in which the sequence of steps that leave solid materials additionally comprises exposure to ultraviolet light.

46. The method of claim 45, in which the sequence of steps that leave solid materials additionally comprises developing the photoresist.

47. The method of claim 38, in which the sequence of steps that leave solid materials comprises an etch process.

* * * * *

UNITED STATES PATENT AND TRADEMARK OFFICE
CERTIFICATE OF CORRECTION

PATENT NO. : 6,849,558 B2
APPLICATION NO. : 10/246379
DATED : February 1, 2005
INVENTOR(S) : Schaper Page 1 of 1

It is certified that error appears in the above-identified patent and that said Letters Patent is hereby corrected as shown below:

In the Specification

Col. 1, line 16-19: "The invention was made with government support under Grant (Contract) No. N66001-01-1-8962 awarded by the Defense Advanced Research Projects Agency (DARPA). The government has certain rights to this invention."

should read

--This invention was made with Government support under contract no. F49620-95-1-0525 awarded by the Air Force Office of Scientific Research, and contract nos. N66001-00-1-8938 and N66001-01-1-8962 awarded by SPA WAR SYS CEN. The U.S. Government has certain rights in this invention.--.

Signed and Sealed this

Twenty-third Day of January, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,849,558 B2 | Page 1 of 1 |
| APPLICATION NO. | : 10/246379 | |
| DATED | : February 1, 2005 | |
| INVENTOR(S) | : Schaper | |

It is certified that error appears in the above-identified patent and that said Letters Patent is hereby corrected as shown below:

<u>In the Specification</u>

Col. 1, line 16-19: "The invention was made with government support under Grant (Contract) No. N66001-01-1-8962 awarded by the Defense Advanced Research Projects Agency (DARPA). The government has certain rights to this invention."

should read

--This invention was made with Government support under contract no. F49620-95-1-0525 awarded by the Air Force Office of Scientific Research, and contract nos. N66001-00-1-8930 and N66001-01-1-8962 awarded by SPA WAR SYS CEN. The U.S. Government has certain rights in this invention.--.

This certificate supersedes Certificate of Correction issued January 23, 2007.

Signed and Sealed this

Seventh Day of August, 2007

JON W. DUDAS
*Director of the United States Patent and Trademark Office*

UNITED STATES PATENT AND TRADEMARK OFFICE
CERTIFICATE OF CORRECTION

PATENT NO.         : 6,849,558 B2                                       Page 1 of 1
APPLICATION NO.    : 10/246379
DATED              : February 1, 2005
INVENTOR(S)        : Schaper et al.

It is certified that error appears in the above-identified patent and that said Letters Patent is hereby corrected as shown below:

In The Specification Under Column 1:

• Please replace lines 16-19 with:

--This invention was made with Government support under contract F49620-95-1-0525 awarded by the Air Force Office of Scientific Research and contract nos. N66001-00-1-8930 and N66001-00-1-8962 awarded by SPA WAR SYS CEN. The U.S. Government has certain rights in this invention.--

Signed and Sealed this
Nineteenth Day of April, 2011

David J. Kappos
*Director of the United States Patent and Trademark Office*